United States Patent
Nakamura et al.

(10) Patent No.: US 10,875,346 B2
(45) Date of Patent: Dec. 29, 2020

(54) LITHOGRAPHIC PRINTING PLATE PRECURSOR, LITHOGRAPHIC PRINTING PLATE MANUFACTURING METHOD AND PRINTING METHOD

(71) Applicant: FUJIFILM Corporation, Tokyo (JP)

(72) Inventors: Ryo Nakamura, Shizuoka (JP); Atsushi Matsuura, Shizuoka (JP); Tsuyoshi Hirokawa, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/175,189

(22) Filed: Oct. 30, 2018

(65) Prior Publication Data

US 2019/0061404 A1 Feb. 28, 2019

Related U.S. Application Data

(63) Continuation of application No. PCT/JP2018/021066, filed on May 31, 2018.

(30) Foreign Application Priority Data

Aug. 31, 2017 (JP) .............................. 2017-166624
Mar. 19, 2018 (JP) .............................. 2018-050990

(51) Int. Cl.
*B41N 1/08* (2006.01)
*B41N 3/03* (2006.01)
(Continued)

(52) U.S. Cl.
CPC .............. *B41N 1/08* (2013.01); *B41C 1/1008* (2013.01); *B41F 7/00* (2013.01); *B41N 1/083* (2013.01); *B41N 3/034* (2013.01); *B41C 2210/08* (2013.01)

(58) Field of Classification Search
None
See application file for complete search history.

(56) References Cited

U.S. PATENT DOCUMENTS

2004/0260050 A1* 12/2004 Munnelly ............. B41C 1/1008
528/176
2009/0226666 A1* 9/2009 Suzuki ................. B22D 11/043
428/141

(Continued)

FOREIGN PATENT DOCUMENTS

CN 101524710 A 9/2009
CN 102241181 A 11/2011
(Continued)

OTHER PUBLICATIONS

Written Opinion for PCT/JP2018/021066 dated Jul. 31, 2018 [PCT/ISA/237].

(Continued)

*Primary Examiner* — Joshua D Zimmerman
(74) *Attorney, Agent, or Firm* — Sughrue Mion, PLLC

(57) ABSTRACT

The present invention provides a lithographic printing plate precursor that enables a lithographic printing plate formed therefrom to have excellent image visibility and a long press life, as well as a lithographic printing plate manufacturing method and a printing method. The lithographic printing plate precursor of the invention is a lithographic printing plate precursor including an aluminum support and an image recording layer, the aluminum support includes an aluminum plate and an anodized film of aluminum formed on the aluminum plate, the anodized film is positioned closer to the image recording layer than the aluminum plate is, the anodized film has micropores extending in a depth direction of the anodized film from a surface of the anodized film on the image recording layer, the micropores have an average diameter of more than 10 nm but not more than 100 nm at (Continued)

the surface of the anodized film, and the surface of the anodized film on the image recording layer side has a lightness L* of 70 to 100 in a L*a*b* color system.

18 Claims, 3 Drawing Sheets

(51) Int. Cl.
  *B41C 1/10* (2006.01)
  *B41F 7/00* (2006.01)

(56) References Cited

U.S. PATENT DOCUMENTS

| | | | |
|---|---|---|---|
| 2011/0265673 | A1 | 11/2011 | Tagawa et al. |
| 2012/0192742 | A1 | 8/2012 | Kurokawa et al. |
| 2012/0298001 | A1 | 11/2012 | Kurokawa et al. |
| 2014/0326151 | A1 | 11/2014 | Namba et al. |
| 2015/0000544 | A1* | 1/2015 | Shiraki ............... C09D 11/106 |
| | | | 101/451 |
| 2015/0135979 | A1* | 5/2015 | Tagawa .................. C25F 3/04 |
| | | | 101/454 |
| 2015/0177618 | A1 | 6/2015 | Teng |
| 2016/0263930 | A1 | 9/2016 | Lenaerts et al. |

FOREIGN PATENT DOCUMENTS

| | | |
|---|---|---|
| CN | 102616049 A | 8/2012 |
| CN | 102686409 A | 9/2012 |
| CN | 104066591 A | 9/2014 |
| CN | 104203588 A | 12/2014 |
| CN | 104487261 A | 4/2015 |
| CN | 105682925 A | 6/2016 |
| EP | 2 353 882 A1 | 8/2011 |
| EP | 2354852 A1 * | 8/2011 ................ G03F 7/11 |
| EP | 2 383 125 A1 | 11/2011 |
| EP | 2 520 439 A1 | 11/2012 |
| EP | 2 808 173 A1 | 12/2014 |
| EP | 2 878 452 A1 | 6/2015 |
| EP | 2 354 852 B1 | 5/2017 |
| JP | 11-286183 A | 10/1999 |
| JP | 2010-026006 A | 2/2010 |
| JP | 2011-175256 A | 9/2011 |
| JP | 2012-158022 A | 8/2012 |
| JP | 2012-192724 A | 10/2012 |
| JP | 2013-078794 A | 5/2013 |
| JP | 2015-189021 A | 11/2015 |
| JP | 2016-539821 A | 12/2016 |
| WO | 2013/145949 A1 | 10/2013 |

OTHER PUBLICATIONS

International Search Report for PCT/JP2018/021066 dated Jul. 31, 2018 [PCT/ISA/210].

Communication dated Jun. 7, 2019 from European Patent Office in counterpart EP Application No. 18789307.8.

Communication dated Sep. 4, 2019 issued by the Intellectual Property Office of People's Republic of China in counterpart application No. 201880001821.3.

Examination Report Under Section 12 & 13 of the Patents Act, 1970 and the Patents Rule 2003, dispatched Dec. 18, 2019, Indian Patent Application 201847040398, 7 pages in Hindi and English.

Communication dated Mar. 19, 2020, from the China National Intellectual Property Administration in Application No. 201880001821.3.

Communication dated Aug. 3, 2020 from the State Intellectual Property Office of the P.R.C. in Application No. 201880001821.3.

* cited by examiner

LITHOGRAPHIC PRINTING PLATE PRECURSOR, LITHOGRAPHIC PRINTING PLATE MANUFACTURING METHOD AND PRINTING METHOD

CROSS-REFERENCE TO RELATED APPLICATIONS

This application is a Continuation of PCT International Application No. PCT/JP2018/021066 filed on May 31, 2018, which claims priority under 35 U.S.C. § 119(a) to Japanese Patent Application No. 2017-166624 filed on Aug. 31, 2017 and Japanese Patent Application No. 2018-050990 filed on Mar. 19, 2018. Each of the above applications is hereby expressly incorporated by reference, in its entirety, into the present application.

TECHNICAL FIELD

The present invention relates to a lithographic printing plate precursor, a lithographic printing plate manufacturing method and a printing method.

BACKGROUND ART

In recent years, lithographic printing plates can be obtained through the CTP (computer-to-plate) technology, and many relevant studies have been made, accordingly.

For instance, Patent Literature 1 discloses a lithographic printing plate precursor using a lithographic printing plate support including an anodized film having predetermined micropores.

CITATION LIST

Patent Literature

Patent Literature 1: JP 2012-158022 A

SUMMARY OF INVENTION

Technical Problems

Meanwhile, lithographic printing plates formed are required to have further improved image visibility. The term "image visibility" refers to visibility of an image portion of a lithographic printing plate.

The present inventors have examined the characteristics of the lithographic printing plate precursor specifically described in Patent Literature 1 and as a result found that the image visibility does not satisfy the currently required level and further improvement is necessary.

Besides, for lithographic printing plate precursors, it is required that lithographic printing plates formed therefrom have a long press life.

In view of the situation as described above, an object of the present invention is to provide a lithographic printing plate precursor that enables a lithographic printing plate formed therefrom to have excellent image visibility and a long press life.

Another object of the present invention is to provide a lithographic printing plate manufacturing method and a printing method.

Solution to Problems

The present inventors have made an intensive study to achieve the objects and as a result found that the foregoing objects can be achieved with the configuration below.

(1) A lithographic printing plate precursor comprising an aluminum support and an image recording layer,
wherein the aluminum support includes an aluminum plate and an anodized film of aluminum formed on the aluminum plate,
wherein the anodized film is positioned closer to the image recording layer than the aluminum plate is,
wherein the anodized film has micropores extending in a depth direction of the anodized film from a surface of the anodized film on the image recording layer side,
wherein the micropores have an average diameter of more than 10 nm but not more than 100 nm at the surface of the anodized film, and
wherein the surface of the anodized film on the image recording layer side has a lightness $L^*$ of 70 to 100 in a $L^*a^*b^*$ color system.

(2) The lithographic printing plate precursor according to (1),
wherein a steepness a45 representing an area ratio of portions having an inclination of at least 45° at the surface of the anodized film on the image recording layer side as determined by extracting components with a wavelength of 0.2 to 2 μm is not more than 30%.

(3) The lithographic printing plate precursor according to (2),
wherein the steepness a45 is not more than 20%.

(4) The lithographic printing plate precursor according to any one of (1) to (3),
wherein the average diameter is from 15 to 60 nm.

(5) The lithographic printing plate precursor according to any one of (1) to (4),
wherein the lightness $L^*$ is from 75 to 100.

(6) The lithographic printing plate precursor according to any one of (1) to (5),
wherein a specific surface area ΔS is not less than 20%, the specific surface area ΔS being a value determined by Formula (i):

$$\Delta S=(S_x-S_o)/S_o\times100(\%) \quad \text{(i)}$$

using an actual area $S_x$ obtained, through three-point approximation, from three-dimensional data acquired by measurement at 512×512 points in 25 μm square of the surface of the anodized film on the image recording layer side by means of an atomic force microscope and a geometrically measured area $S_0$.

(7) The lithographic printing plate precursor according to (6),
wherein the specific surface area ΔS is from 20% to 40%.

(8) The lithographic printing plate precursor according to any one of (1) to (7),
wherein each of the micropores has a large-diameter portion which extends from the surface of the anodized film to a depth of 10 to 1000 nm and a small-diameter portion which communicates with a bottom of the large-diameter portion and extends to a depth of 20 to 2,000 nm from a communication position between the small-diameter portion and the large-diameter portion,
wherein an aperture average diameter of the large-diameter portion at the surface of the anodized film is 15 to 100 nm, and
wherein an aperture average diameter of the small-diameter portion at the communication position is not more than 13 nm.

(9) The lithographic printing plate precursor according to any one of (1) to (8),
wherein the image recording layer contains a polymeric compound in a form of fine particles, and wherein the polymeric compound in the form of fine particles is a copolymer of styrene-(meth)acrylonitrile-poly(ethylene glycol) monoalkyl ether (meth)acrylate compound.

(10) The lithographic printing plate precursor according to any one of (1) to (9), wherein the image recording layer further contains a borate compound.

(11) The lithographic printing plate precursor according to any one of (1) to (10), wherein the image recording layer further contains an acid color former.

(12) The lithographic printing plate precursor according to any one of (1) to (11), further including an undercoat layer between the aluminum support and the image recording layer.

(13) The lithographic printing plate precursor according to (12), wherein the undercoat layer contains a compound having a betain structure.

(14) A method of manufacturing a lithographic printing plate, comprising:

an exposure step of imagewise exposing the lithographic printing plate precursor according to any one of (1) to (13) to form exposed portions and unexposed portions; and a removal step of removing the unexposed portions of the lithographic printing plate precursor having been imagewise exposed.

(15) A printing method, comprising:

an exposure step of imagewise exposing the lithographic printing plate precursor according to any one of (1) to (14) to form exposed portions and unexposed portions; and a printing step of performing printing by supplying at least one of printing ink and fountain solution to remove the unexposed portions of the lithographic printing plate precursor having been imagewise exposed, on a printing press.

Advantageous Effects of Invention

The present invention can provide a lithographic printing plate precursor that enables a lithographic printing plate formed therefrom to have excellent image visibility and a long press life.

The present invention can also provide a lithographic printing plate manufacturing method and a printing method.

DESCRIPTION OF EMBODIMENTS

A lithographic printing plate precursor, a lithographic printing plate manufacturing method and a printing method according to the invention are described below.

In the present description, a numerical range expressed by using "to" is a range including values stated before and after "to" as the upper and lower limits of the range.

In the present description, when there is no mention as to whether a group in a compound expressed by a formula is substituted or unsubstituted, in cases where the group can further have a substituent, the group comprises not only an unsubstituted group but also a group with a substituent unless otherwise specified. For instance, when a formula is accompanied by the description "R is an alkyl group, an aryl group or a heterocyclic group," this means "R is an unsubstituted alkyl group, a substituted alkyl group, an unsubstituted aryl group, a substituted aryl group, an unsubstituted heterocyclic group or a substituted heterocyclic group."

The lithographic printing plate precursor of the invention is characterized in that, inter alia, micropores have an average diameter of more than 10 nm but not more than 100 nm at a surface of an anodized film and the surface of the anodized film on an image recording layer side has a lightness L* of 70 to 100 in the L*a*b* color system. The average diameter within the predetermined range leads to a longer press life and improved image visibility, and the lightness L* within the predetermined range leads to improved image visibility. In particular, the present inventors have made a study on problems of the conventional art and as a result found for the first time that the lightness L* of the surface of the anodized film on the image recording layer side influences image visibility and thus, the lightness value falling within the predetermined range leads to the desired effect.

The lithographic printing plate precursor of the invention also has excellent scumming resistance and deinking ability. To evaluate the deinking ability, the number of sheets wasted when printing having been suspended is resumed is rated, and the deinking ability is determined to be excellent when the number of wasted sheets is small.

The lithographic printing plate precursor having the foregoing properties can be manufactured by a known method, as described later in detail. In particular, the lithographic printing plate precursor can easily be manufactured by adjusting the amount of dissolution of an aluminum plate during alkali etching treatment performed after electrochemical graining treatment in a step of surface roughening treatment.

Figure 1:
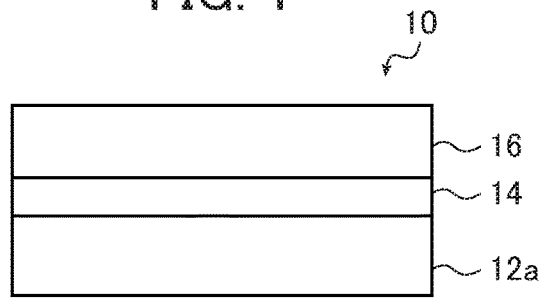
FIG. 1 is a schematic cross-sectional view of an example of a lithographic printing plate precursor of the invention.

FIG. 1 is a schematic cross-sectional view of an embodiment of a lithographic printing plate precursor of the invention.

A lithographic printing plate precursor 10 shown in the drawing includes an aluminum support 12a, an undercoat layer 14 and an image recording layer 16.

Figure 2:
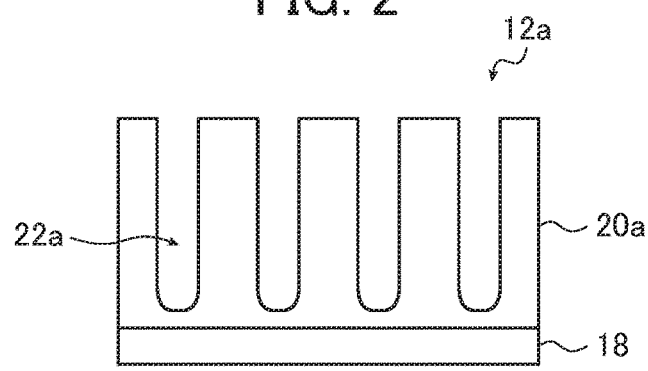
FIG. 2 is a schematic cross-sectional view of an example of an aluminum support.

FIG. 2 is a schematic cross-sectional view of an embodiment of the aluminum support 12a. The aluminum support 12a has a laminated structure in which an aluminum plate 18 and an anodized aluminum film 20a (hereinafter also simply called "anodized film 20a") are stacked in this order. The anodized film 20a in the aluminum support 12a is positioned closer to the image recording layer 16 than the aluminum plate 18 is. That is, the lithographic printing plate precursor 10 has the aluminum plate 18, the anodized film 20a, the undercoat layer 14 and the image recording layer 16 in this order.

The anodized film 20a has micropores 22a extending from the surface of the film toward the aluminum plate 18 side. The term "micropore" used herein is commonly used to denote a pore in an anodized film and does not define the size of the pore.

As described later, the undercoat layer 14 is not essential and is provided if necessary.

The respective constituents of the lithographic printing plate precursor 10 are described below in detail.

<Aluminum Plate>

The aluminum plate 18 (aluminum support) is made of a dimensionally stable metal composed primarily of aluminum; that is, aluminum or aluminum alloy. Exemplary materials of the aluminum plate 18 include a pure aluminum plate, alloy plates composed primarily of aluminum and containing small amounts of other elements, and plastic films or paper on which aluminum (alloy) is laminated or vapor-deposited.

Other elements which may be present in the aluminum alloy include silicon element, iron element, manganese element, copper element, magnesium element, chromium element, zinc element, bismuth element, nickel element and titanium element. The content of other elements in the alloy is not more than 10 wt %. The aluminum plate 18 is preferably made of pure aluminum but may contain small amounts of other elements because it is difficult to manufacture completely pure aluminum from the viewpoint of smelting technology.

The aluminum plate 18 is not limited in its composition, and conventionally known materials (e.g., JIS A 1050, JIS A 1100, JIS A 3103 and JIS A 3005) can be appropriately used.

The aluminum plate 18 preferably has a width of about 400 to about 2,000 mm and a thickness of about 0.1 to about 0.6 mm. The width and thickness may be changed as appropriate based on such considerations as the size of the printing press, the size of the printing plate and the desires of the user.

<Anodized Film>

The anodized film 20a refers to a film that is generally formed on a surface of the aluminum plate 18 by anodizing treatment and has the micropores 22a which are substantially vertical to the film surface and are individually distributed in a uniform manner. The micropores 22a extend in the thickness direction of the anodized film from the surface of the anodized film 20a on the image recording layer 16 side (i.e., the surface of the anodized film 20a on the side opposite from the aluminum plate 18) (toward the aluminum plate 18 side).

The micropores 22a in the anodized film 20a have an average diameter (average aperture size) of more than 10 nm but not more than 100 nm at the surface of the anodized film. In particular, the average diameter is preferably 15 to 60 nm, more preferably 20 to 50 nm and even more preferably 25 to 40 nm for the sake of the balance among a press life, scumming resistance and image visibility. The diameter inside pores may be larger or smaller than that at the surface.

An average diameter of 10 nm or less leads to a short press life and poor image visibility. An average diameter of more than 100 nm leads to a short press life.

The average diameter of the micropores 22a is determined as follows: The surface of the anodized film 20a is observed with a field emission scanning electron microscope (FE-SEM) at a magnification of 150,000× to obtain four images (N=4), in the resulting four images, the diameter of the micropores within an area of 400×600 $nm^2$ is measured at 50 places, and the average of the measurements is calculated.

The equivalent circle diameter is used if the shape of the micropores 22a is not circular. The "equivalent circle diameter" refers to the diameter of a circle assuming that the shape of the aperture is the circle having the same projected area as that of the aperture.

The depth of the micropores 22a is not particularly limited and is preferably 10 to 3,000 nm, more preferably 50 to 2,000 nm and even more preferably 300 to 1,600 nm.

The depth is determined by taking a cross-sectional image of the anodized film 20a (at a magnification of 150,000×), measuring the depth of at least 25 micropores 22a, and calculating the average of the measurements.

The shape of the micropores 22a is not particularly limited. While the shape is a substantially straight tubular shape (substantially columnar shape) in FIG. 2, it may be a conical shape in which the diameter decreases in the depth direction (thickness direction). The bottom shape of the micropores 22a is not particularly limited and may be curved (convex) or flat.

The surface of the aluminum support 12a on the image recording layer 16 side (i.e., the surface of the anodized film 20a on the image recording layer 16 side) has a lightness L* of 70 to 100 in the L*a*b* color system. In particular, the lightness L* is preferably 75 to 100 and more preferably 75 to 90 because this results in more excellent balance between a press life and image visibility.

The lightness L* is measured with SpectroEye colorimeter manufactured by X-rite Inc.

The range of the steepness a45 representing an area ratio of portions having an inclination of at least 45° on the surface of the anodized film 20a on the image recording layer 16 side as determined by extracting components with a wavelength of 0.2 to 2 μm is not particularly limited; the range of the steepness a45 is preferably not more than 25%, more preferably not more than 20% and even more preferably not more than 18% because this results in more excellent scumming resistance and deinking ability. The lower limit thereof is not particularly limited and is usually not less than 5%.

The steepness a45 is one factor representing a surface profile and is determined according to the following procedures (1) to (3).

(1) The surface profile is measured to obtain three-dimensional data.

First, the surface profile of the aluminum support 12a on the anodized film 20a side is measured with an atomic force microscope (AFM) to obtain three-dimensional data.

Measurement is carried out under, for example, the following conditions. Specifically, a 1 cm square sample is cut out from the aluminum support 12a and placed on a horizontal sample holder on a piezoelectric scanner. A cantilever is then moved to approach the surface of the sample. When the cantilever reaches the zone where interatomic forces are detectable, the surface of the sample is scanned in the XY direction, and the surface topography of the sample is read based on the piezoelectric displacement in the Z direction. The piezoelectric scanner used is capable of scanning 150 μm in the XY direction and 10 μm in the Z direction. The cantilever having a resonance frequency of 120 to 150 kHz and a spring constant of 12 to 20 N/m (SI-DF20 manufactured by NANOPROBE) is used, and the measurement is carried out in DFM (dynamic force mode). The three-dimensional data obtained is subjected to least-squares approximation to compensate for slight tilt of the sample and determine a reference plane.

In the measurement, 512×512 points in 25 μm square of the surface are measured. The resolution is 1.9 μm in the XY direction and 1 nm in the Z direction. The scan rate is 60 μm/s.

(2) Correction is made.

For calculation of the steepness a45, use is made of data having been undergone the correction in which components with a wavelength of 0.2 to 2 μm are selected from the three-dimensional data obtained in (1) above. This correction can remove noises that are generated when, for instance, in scanning such a surface having great irregularities as that of an aluminum support used in a lithographic printing plate precursor by means of a probe of AFM, the probe makes contact with an edge of a bump and is thereby flipped or a certain portion of the probe other than its tip makes contact with a wall surface of a deep dent.

The correction is performed by subjecting the three-dimensional data obtained in (1) above to the fast Fourier transform to obtain a frequency distribution, subsequently selecting the components with a wavelength of 0.2 to 2 μm and then carrying out the inverse Fourier transform.

(3) The steepness a45 is calculated.

Using the three-dimensional data (f(x,y)) obtained through the correction in (2) above, sets of adjacent three points are extracted, and each angle between a microtriangle formed by a set of adjacent three points and the reference plane is calculated for all the data to thereby obtain an inclination distribution curve. Besides, the areas of the microtriangles formed by the sets of adjacent three points are summated, and the sum is defined as the actual area. From the inclination distribution curve, the steepness a45 (unit: %) that is the proportion of the area of portions having an inclination of at least 45° with respect to the actual area, is calculated.

The range of a specific surface area ΔS, which is a value determined by Formula (i) below using an actual area $S_x$ obtained, through three-point approximation, from the three-dimensional data acquired by measurement at 512×512 points in 25 μm square of the surface of the anodized film 20a on the image recording layer 16 side by means of an atomic force microscope and a geometrically measured area $S_o$, is not particularly limited and is usually not less than 15%; the range is preferably not less than 20%, more preferably 20% to 40% and even more preferably 25% to 35% because this results in more excellent scumming resistance, deinking ability and image visibility.

$$\Delta S = (S_x - S_o)/S_o \times 100(\%) \quad (i)$$

The ΔS is determined as follows: First, three-dimensional data (f(x,y)) is obtained according to the same procedure as that stated in (1) conducted in calculation of the steepness a45.

Next, using the three-dimensional data (f(x,y)) obtained above, sets of adjacent three points are extracted, and the areas of microtriangles formed by the sets of adjacent three points are summated, and the sum is defined as the actual area $S_x$. The surface area difference ΔS is calculated by Formula (1) above using the obtained actual area $S_x$ and the geometrically measured area $S_0$.

<Undercoat Layer>

The undercoat layer 14 is a layer disposed between the aluminum support 12a and the image recording layer 16 and improves the adhesion therebetween. As described above, the undercoat layer 14 is provided as needed and is not essential for the lithographic printing plate precursor.

The undercoat layer is not particularly limited in structure and preferably includes a compound having a betaine structure because this results in more excellent scumming resistance and deinking ability.

The betaine structure refers to a structure having at least one cation and at least one anion. The number of cations and the number of anions are typically the same, so that the structure is to be neutral as a whole; in the present invention, a structure having necessary amount of counter-ions to cancel out the charge when the number of cations and the number of anions are different is also defined as the betaine structure.

The betain structure is preferably one of the structure expressed by Formula (1), the structure expressed by Formula (2) and the structure expressed by Formula (3) shown below.

[Chemical Formula 1]

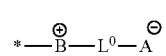

Formula (1)

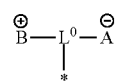

Formula (2)

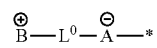

Formula (3)

In Formulae, A⁻ represents a structure having an anion, B⁺ represents a structure having a cation, and L⁰ represents a linking group. * represents a linkage moiety (linkage position).

A⁻ preferably represents a structure having an anion such as carboxylate, sulfonate, phosphonate or phosphinate, and B⁺ preferably represents a structure having a cation such as ammonium, phosphonium, iodonium or sulfonium.

L⁰ represents a linking group. In Formulae (1) and (3), one example of L⁰ is a divalent linking group, and preferred examples thereof include —CO—, —O—, —NH—, a divalent aliphatic group, a divalent aromatic group, and combinations thereof. In Formula (2), one example of L⁰ is a trivalent linking group.

The linking group above is preferably one having up to 30 carbon atoms including the number of carbon atoms in a substituent that is optionally contained, which will be described later.

Specific examples of the linking group include alkylene groups (having preferably 1 to 20 carbon atoms and more preferably 1 to 10 carbon atoms), and arylene groups (having preferably 5 to 15 carbon atoms and more preferably 6 to 10 carbon atoms) such as a phenylene group and a xylylene group.

Those linking group may further have a substituent.

Examples of the substituent include a halogen atom, a hydroxyl group, a carboxyl group, an amino group, a cyano group, an aryl group, an alkoxy group, an aryloxy group, an acyl group, an alkoxycarbonyl group, an aryloxycarbonyl group, an acyloxy group, a monoalkylamino group, a dialkylamino group, a monoarylamino group and a diarylamino group.

The betaine structure is preferably the structure expressed by Formula (i), the structure expressed by Formula (ii), or the structure expressed by Formula (iii) because at least one of a press life, scumming resistance, deinking ability and image visibility can be improved (hereinafter also simply referred to as "because the effects of the invention can be more excellent"), and the structure expressed by Formula (i) is more preferred. * represents a linkage moiety.

[Chemical Formula 2]

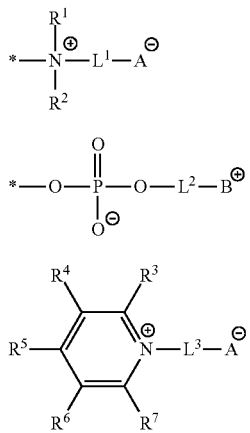

In Formula (i), $R^1$ and $R^2$ each independently represent a hydrogen atom, an alkyl group, an alkenyl group, an alkynyl group, an aryl group or a heterocyclic group; $R^1$ and $R^2$ may be bonded together to form a ring structure.

The ring structure may include a heteroatom such as an oxygen atom. For the ring structure, a 5- to 10-membered ring is preferred, and a 5- or 6-membered ring is more preferred.

The number of carbon atoms in $R^1$ and $R^2$ is preferably 1 to 30 and more preferably 1 to 20.

For $R^1$ and $R^2$, a hydrogen atom, a methyl group and an ethyl group are preferred because the effects of the invention can be more excellent.

L* represents a divalent linking group, and preferred examples thereof include —CO—, —O—, —NH—, a divalent aliphatic group (e.g., alkylene group), a divalent aromatic group (e.g., phenylene group), and combinations thereof.

For $L^1$, a linear alkylene group having 3 to 5 carbon atoms is preferred.

In Formula (1), A represents a structure having an anion, and preferred examples thereof include carboxylate, sulfonate, phosphonate and phosphinate.

Specifically, examples thereof include the following structures.

[Chemical Formula 3]

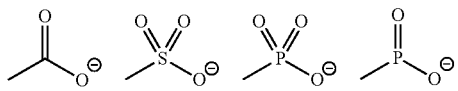

Formula (i) has preferably a combination of $L^1$ being a linear alkylene group having 4 or 5 carbon atoms and $A^-$ being sulfonate, and more preferably a combination of $L^1$ being a linear alkylene group having 4 carbon atoms and $A^-$ being sulfonate.

In Formula (ii), $L^2$ represents a divalent linking group, and preferred examples thereof include —CO—, —O—, —NH—, a divalent aliphatic group (e.g., alkylene group), a divalent aromatic group (e.g., phenylene group), and combinations thereof.

$B^+$ represents a structure having a cation, and a structure having ammonium, phosphonium, iodonium or sulfonium is preferred. Of these, a structure having ammonium or phosphonium is preferred, and a structure having ammonium is more preferred.

Examples of the structure having a cation include a trimethylammonio group, a triethylammonio group, a tributylammonio group, a benzyldimethylammonio group, a diethylhexylammonio group, a (2-hydroxyethyl)dimethylammonio group, a pyridinio group, an N-methylimidazolio group, an N-acridinio group, a trimethylphosphonio group, a triethylphosphonio group and a triphenylphosphonio group.

In Formula (iii), $L^3$ represents a divalent linking group, and preferred examples thereof include —CO—, —O—, —NH—, a divalent aliphatic group (e.g., alkylene group), a divalent aromatic group (e.g., phenylene group), and combinations thereof.

$A^-$ represents a structure having an anion, and preferred examples thereof include carboxylate, sulfonate, phosphonate and phosphinate. The details and preferred examples thereof are the same as those for $A^-$ in Formula (i).

$R^3$ to $R^7$ each independently represent a hydrogen atom or a substituent (having preferably 1 to 30 carbon atoms), and at least one of $R^3$ to $R^7$ represents a linkage moiety.

At least one of $R^3$ to $R^7$ being a linkage moiety may be bonded to another moiety in the compound via a substituent which is at least one of $R^3$ to $R^7$ or directly bonded to another moiety in the compound by a single bond.

Examples of the substituent represented by $R^3$ to $R^7$ include a halogen atom, alkyl groups (including a cycloalkyl group and a bicycloalkyl group), alkenyl groups (including a cycloalkenyl group and a bicycloalkenyl group), an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, amino groups (including an anilino group), an acylamino group, an aminocarbonylamino group, an alkoxycarbonylamino group, an aryloxycarbonylamino group, a sulfamoylamino group, alkyl and aryl sulfonylamino groups, a mercapto group, an alkylthio group, an arylthio group, a heterocyclic thio group, a sulfamoyl group, a sulfo group, alkyl and aryl sulfinyl groups, alkyl and aryl sulfonyl groups, an acyl group, an aryloxycarbonyl group, an alkoxycarbonyl group, a carbamoyl group, aryl and heterocyclic azo groups, an imide group, a phosphino group, a phosphinyl group, a phosphinyloxy group, a phosphinylamino group and a silyl group.

The compound above is preferably a polymer including a repeating unit having the betaine structure (hereinafter also simply called "specific polymer") because the effects of the invention can be more excellent. For the repeating unit having the betaine structure, the repeating unit expressed by Formula (A1) is preferred.

[Chemical Formula 4]

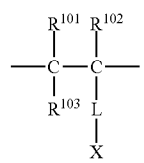

In the formula, $R^{101}$ to $R^{103}$ each independently represent a hydrogen atom, an alkyl group or a halogen atom. L represents a single bond or a divalent linking group.

Examples of the divalent linking group include —CO—, —O—, —NH—, a divalent aliphatic group, a divalent aromatic group, and combinations thereof.

Specific examples of the combinations constituting L are shown below. Note that, in the following examples, the left side is bonded to the main chain and the right side is bonded to X.

L1: —CO—O-divalent aliphatic group-
L2: —CO—O-divalent aromatic group-
L3: —CO—NH-divalent aliphatic group-
L4: —CO—NH-divalent aromatic group-
L5: —CO-divalent aliphatic group-
L6: —CO-divalent aromatic group-
L7: —CO-divalent aliphatic group-CO—O-divalent aliphatic group-
L8: —CO-divalent aliphatic group-O—CO-divalent aliphatic group-L9: —CO-divalent aromatic group-CO—O-divalent aliphatic group-
L10: —CO-divalent aromatic group-O—CO-divalent aliphatic group-
L11: —CO-divalent aliphatic group-CO—O-divalent aromatic group-
L12: —CO-divalent aliphatic group-O—CO-divalent aromatic group-
L13: —CO-divalent aromatic group-CO—O-divalent aromatic group-
L14: —CO-divalent aromatic group-O—CO-divalent aromatic group-
L15: —CO—O-divalent aromatic group-O—CO—NH-divalent aliphatic group-
L16: —CO—O-divalent aliphatic group-O—CO—NH-divalent aliphatic group- Examples of the divalent aliphatic group include an alkylene group, an alkenylene group and an alkynylene group.

Examples of the divalent aromatic group include aryl groups, and preferred are a phenylene group and a naphthylene group.

X represents the betaine structure. X is preferably one of the structure expressed by Formula (i), the structure expressed by Formula (ii) and the structure expressed by Formula (iii) shown above.

In particular, Formula (A1) preferably has a combination of L being L1 or L3, X being the structure expressed by Formula (i), and $A^-$ in Formula (i) being a sulfonate group.

The amount of the repeating unit having the betaine structure in the specific polymer is not particularly limited and is usually 20 to 95 wt %; the amount is preferably 50 to 95 wt % and more preferably 60 to 90 wt % with respect to the total amount of all repeating units constituting the specific polymer because the effects of the invention can be more excellent.

The specific polymer may include another repeating unit in addition to the repeating unit having the betaine structure.

The specific polymer may include a repeating unit having a structure that interacts with a surface of the aluminum support 12a (hereinafter also simply called "interacting structure").

Examples of the interacting structure include a carboxylic acid structure, a carboxylic acid salt structure, a sulfonic acid structure, a sulfonic acid salt structure, a phosphonic acid structure, a phosphonic acid salt structure, a phosphate ester structure, a phosphate ester salt structure, a β-diketone structure and a phenolic hydroxyl group, as exemplified by the structures expressed by the formulae shown below. Of these, a carboxylic acid structure, a carboxylic acid salt structure, a sulfonic acid structure, a sulfonic acid salt structure, a phosphonic acid structure, a phosphonic acid salt structure, a phosphate ester structure, and a phosphate ester salt structure are preferred.

[Chemical Formula 5]

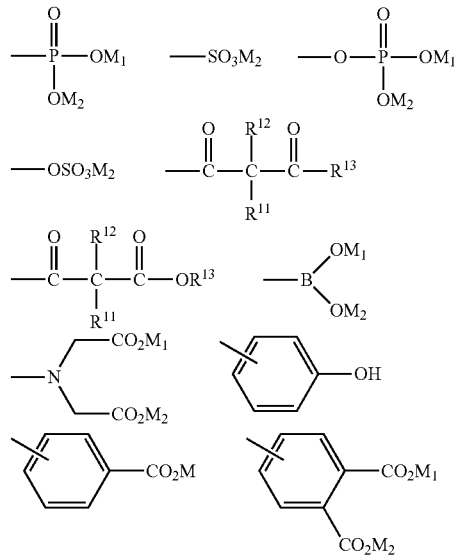

In the formulae above, $R^{11}$ to $R^{13}$ each independently represent a hydrogen atom, an alkyl group, an aryl group, an alkynyl group or an alkenyl group, and M, $M_1$ and $M_2$ each independently represent a hydrogen atom, a metal atom (e.g., an alkali metal atom such as Na or Li) or an ammonium group. B represents a boron atom.

For the repeating unit having the interacting structure, the repeating unit expressed by Formula (A2) is preferred.

[Chemical Formla 6]

(A2)

In the formula, $R^{201}$ to $R^{203}$ each independently represent a hydrogen atom, an alkyl group (preferably having 1 to 6 carbon atoms) or a halogen atom.

L represents a single bond or a divalent linking group. Examples of the divalent linking group include —CO—, —O—, —NH—, a divalent aliphatic group, a divalent aromatic group, and combinations thereof.

Specific examples of the combinations constituting L include, in addition to those stated for Formula (A1) above, L17 and L18 below.

L17: —CO—NH—
L18: —CO—O—

Among L1 to L18, L1 to L4, L17 and L18 are preferred.

Q represents the interacting structure, and preferred examples thereof are the same as those listed above.

The amount of the repeating unit having the interacting structure in the specific polymer is not particularly limited and is preferably 1 to 40 wt % and more preferably 3 to 30 wt % with respect to the total amount of all repeating units constituting the specific polymer because the effects of the invention can be more excellent.

The specific polymer may include a repeating unit having a radical polymerizable group.

Examples of the radical polymerizable group include addition-polymerizable, unsaturated bond groups (e.g., a (meth)acryloyl group, a (meth)acrylamide group, a (meth) acrylonitrile group, an allyl group, a vinyl group, a vinyloxy group and an alkynyl group) and chain-transferable, functional groups (e.g., a mercapto group).

The specific polymer including the repeating unit having the radical polymerizable group can be obtained by introducing the radical polymerizable group by the method described in JP 2001-312068 A. The use of the specific polymer including the repeating unit having the radical polymerizable group makes it possible to achieve excellent developability in unexposed portions, while polymerization serves to suppress permeability of a developer in exposed portions, thus further improving bonding properties and adhesion between the aluminum support 12a and the image recording layer 16.

The amount of the repeating unit having the radical polymerizable group in the specific polymer is not particularly limited and is preferably 1 to 30 wt % and more preferably 3 to 20 wt % with respect to the total amount of all repeating units constituting the specific polymer because the effects of the invention can be more excellent.

The amount of the compound having the betaine structure in the undercoat layer 14 is not particularly limited and is preferably not less than 80 wt % and more preferably not less than 90 wt % with respect to the total weight of the undercoat layer. The upper limit thereof is, for instance, 100 wt %.

While the undercoat layer 14 containing the compound having the betain structure is described in the foregoing, an undercoat layer containing another compound may be employed.

For example, an undercoat layer containing a compound having a hydrophilic group may be employed. Examples of the hydrophilic group include a carboxylic acid group and a sulfonic acid group.

The compound having the hydrophilic group may further have a radical polymerizable group.

<Image Recording Layer>

The image recording layer 16 is preferably one that is removable with printing ink and/or fountain solution.

The constituents of the image recording layer 16 are described below.

(Infrared Absorber)

The image recording layer 16 preferably includes an infrared absorber.

The infrared absorber preferably has an absorption maximum in a wavelength range from 750 to 1,400 nm. In particular, when the lithographic printing plate precursor is of on-press development type, on-press development is sometimes carried out with a printing press under a white lamp; therefore, the use of the infrared absorber having an absorption maximum in a wavelength range from 750 to 1,400 nm, which is hardly influenced by a white lamp, makes it possible to obtain the lithographic printing plate precursor having excellent developability.

For the infrared absorber, a dye or a pigment is preferred.

Usable dyes include commercial dyes and known dyes that are mentioned in the technical literature, such as Senryo Binran [Handbook of Dyes] (The Society of Synthetic Organic Chemistry, Japan, 1970).

Specific examples of the dye include cyanine dyes, squarylium dyes, pyrylium salts, nickel-thiolate complexes and indolenine cyanine dyes. Of these, preferred are cyanine dyes and indolenine cyanine dyes, more preferred are cyanine dyes, and even more preferred are cyanine dyes expressed by Formula (a) below.

Formula (a)

[Chemical Formula 7]

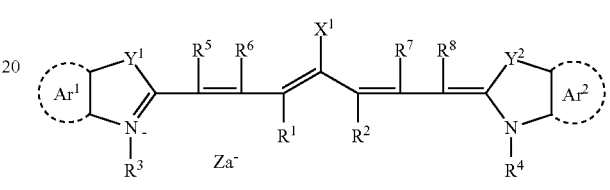

In Formula (a), $X^1$ represents a hydrogen atom, a halogen atom, $-N(R^9)(R^{10})$, $-X^2-L^1$ or the following group.

[Chemical Formula 8]

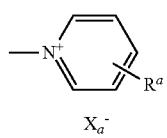

$R^9$ and $R^{10}$ each independently represent an aromatic hydrocarbon group, an alkyl group or a hydrogen atom; $R^9$ and $R^{10}$ may be bonded together to form a ring. In particular, a phenyl group is preferred.

$X^2$ represents an oxygen atom or a sulfur atom, and $L^1$ represents a hydrocarbon group having 1 to 12 carbon atoms and optionally a heteroatom (N, S, O, a halogen atom, Se).

$X_a^-$ is defined in the same way as $Z_a^-$ described below, and $R^a$ represents a hydrogen atom, an alkyl group, an aryl group, an amino group or a halogen atom.

$R^1$ and $R^2$ each independently represent a hydrocarbon group having 1 to 12 carbon atoms. $R^1$ and $R^2$ may be bonded together to form a ring, and the ring formed is preferably a 5- or 6-membered ring.

$Ar^1$ and $Ar^2$ each independently represent an aromatic hydrocarbon group optionally having a substituent (e.g., an alkyl group). For the aromatic hydrocarbon group, a benzene ring group and a naphthalene ring group are preferred.

$Y^1$ and $Y^2$ each independently represent a sulfur atom or a dialkylmethylene group having up to 12 carbon atoms.

$R^3$ and $R^4$ each independently represent a hydrocarbon group having up to 20 carbon atoms and optionally a substituent (e.g., an alkoxy group).

$R^5$, $R^6$, $R^7$ and $R^9$ each independently represent a hydrogen atom or a hydrocarbon group having up to 12 carbon atoms. $Z_a^-$ represents a counteranion. In cases where the cyanine dye expressed by Formula (a) has an anionic substituent in the structure and there is no need for charge neutralization, $Z_a^-$ is unnecessary. Examples of $Z_a^-$ include halide ion, perchlorate ion, tetrafluoroborate ion, hexafluorophosphate ion and sulfonate ion; and perchlorate ion, hexafluorophosphate ion and arylsulfonate ion are preferred.

The foregoing infrared absorbing dyes may be used alone or in combination of two or more thereof, or in combination with infrared absorbers other than the infrared absorbing dyes such as pigments. Exemplary pigments that may be preferably used include compounds described in paragraphs [0072] to [0076] of JP 2008-195018 A.

The infrared absorber content is preferably from 0.05 to 30 wt % and more preferably from 0.1 to 20 wt % with respect to the total weight of the image recording layer 16.

(Polymerization Initiator)

The image recording layer 16 preferably includes a polymerization initiator.

The polymerization initiator is preferably a compound that generates a radical under light or heat energy or both and initiates polymerization of a compound having a polymerizable unsaturated group (so-called radical polymerization initiator). Examples of the polymerization initiator include photopolymerization initiators and thermal polymerization initiators.

Specifically, for the polymerization initiator, polymerization initiators described in paragraphs [0115] to [0141] of JP 2009-255434 A may be used.

For the polymerization initiator, oxime ester compounds and onium salts such as diazonium salts, iodonium salts and sulfonium salts are preferred for the sake of reactivity and stability.

Examples of the polymerization initiator further include borate compounds.

Exemplary borate compounds include organic borate compounds described in paragraph [0028] of JP 2008-195018 A.

Specific examples of the borate compounds include tetraphenylborate salts, tetratolylborate salts, tetrakis(4-methoxyphenyl)borate salts, tetrakis(pentafluorophenyl)borate salts, tetrakis(3,5-bis(trifluoromethyl)phenyl) borate salts, tetrakis(4-chlorophenyl)borate salts, tetrakis(4-fluorophenyl)borate salts, tetrakis(2-thienyl)borate salts, tetrakis(4-phenylphenyl)borate salts, tetrakis(4-t-butylphenyl)borate salts, ethyltriphenylborate salts and butyltriphenylborate salts.

The polymerization initiator content is preferably from 0.1 to 50 wt % and more preferably from 0.5 to 30 wt % with respect to the total weight of the image recording layer 16.

(Polymerizable Compound)

The image recording layer 16 preferably includes a polymerizable compound.

The polymerizable compound is preferably an addition polymerizable compound having at least one ethylenically unsaturated bond. In particular, a compound having at least one (preferably at least two) terminal ethylenically unsaturated bond is more preferred. A so-called radical polymerizable compound is more preferred.

For the polymerizable compound, for instance, polymerizable compounds described in paragraphs [01.42] to [0163] of JP 2009-255434 A may be used.

Addition polymerizable urethane compounds produced using an addition reaction between an isocyanate group and a hydroxyl group are also suitable. Specific examples thereof include vinylurethane compounds having two or more polymerizable vinyl groups in the molecule that are obtained by adding a hydroxyl group-bearing vinyl monomer of Formula (A) below to the polyisocyanate compounds having two or more isocyanate groups in the molecule mentioned in JP 48-41708 B.

$$CH_2=C(R^4)COOCH_2CH(R^5)OH \quad (A)$$

(wherein $R^4$ and $R^5$ are H or $CH_3$)

The polymerizable compound content is preferably from 3 to 80 wt % and more preferably from 10 to 75 wt % with respect to the total weight of the image recording layer 16.

(Binder Polymer)

The image recording layer 16 preferably includes a binder polymer.

Examples of the binder polymer include known binder polymers. Specific examples of such binder polymers include acrylic resins, polyvinyl acetal resins, polyurethane resins, polyurea resins, polyimide resins, polyamide resins, epoxy resins, methacrylic resins, polystyrene resins, novolac-type phenolic resins, polyester resins, synthetic rubbers and natural rubbers.

Crosslinkability may be imparted to the binder polymer to enhance the film strength in image areas. To impart crosslinkability to the binder polymer, a crosslinkable functional group such as an ethylenically unsaturated bond may be introduced into the polymer main chain or side chain. The crosslinkable functional group may be introduced by copolymerization.

For the binder polymer, for instance, binder polymers disclosed in paragraphs [0165] to [0172] of JP 2009-255434 A may be used.

The binder polymer may be a polymeric compound in the form of fine particles. In other words, the binder polymer may be polymer particles.

Examples of the polymeric compound in the form of fine particles (the polymer constituting the polymer particles) include homopolymers or copolymers of monomers such as ethylene, styrene, vinyl chloride, methyl acrylate, ethyl acrylate, methyl methacrylate, ethyl methacrylate, vinylidene chloride, acrylonitrile, vinyl carbazole, and acrylate or methacrylate having a polyalkylene structure, and mixtures thereof. More specifically, one example is a copolymer of styrene-(meth)acrylonitrile-poly(ethylene glycol) monoalkyl ether (meth)acrylate compound.

The binder polymer content is preferably from 5 to 90 wt % and more preferably from 5 to 70 wt % with respect to the total weight of the image recording layer 16.

(Surfactant)

The image recording layer 16 may contain a surfactant in order to promote on-press developability at the start of printing and improve the coating surface state.

Exemplary surfactants include nonionic surfactants, anionic surfactants, cationic surfactants, amphoteric surfactants and fluorosurfactants.

For the surfactant, for example, surfactants disclosed in paragraphs [0175] to [0179] of JP 2009-255434 A may be used.

The surfactant content is preferably from 0.001 to 10 wt % and more preferably from 0.01 to 5 wt % with respect to the total weight of the image recording layer 16.

The image recording layer 16 may also optionally contain various other compounds than those mentioned above.

Examples of other compounds include colorants, printing-out agents, polymerization inhibitors, higher fatty acid derivatives, plasticizers, inorganic fine particles and low-molecular-weight hydrophilic compounds, which are disclosed in paragraphs [0181] to [0190] of JP 2009-255434 A.

Further examples of other compounds include hydrophobilizing precursors (fine particles capable of converting the image recording layer to be hydrophobic when heat is applied), sensitizers (e.g., phosphonium compounds, nitrogen-containing low-molecular-weight compounds, ammonium group-bearing polymers), and chain transfer agents, which are disclosed in paragraphs [0191] to [0217] of JP 2012-187907 A.

Another example of other compounds is an acid color former.

The acid color former refers to a compound having properties of developing a color when heat is applied under the state where the compound has accepted an electron-accepting compound (e.g., a proton of an acid or the like). Preferred examples of the acid color former include colorless compounds that have a partial skeleton such as lactone, lactam, sultone, spiropyran, ester or amide and that, upon contact with an electron-accepting compound, exhibit immediate ring-opening or cleavage of the partial skeleton.

The acid color former is preferably at least one compound selected from the group consisting of spiropyran compounds, spirooxazine compounds, spirolactone compounds and spirolactam compounds.

<Others>

The lithographic printing plate precursor of the invention may include other layers in addition to the aluminum support 12a, the undercoat layer 14 and the image recording layer 16 described above.

For instance, the lithographic printing plate precursor may optionally include a protective layer formed on the image recording layer 16 to prevent scuffing and other damage to the image recording layer 16, to serve as an oxygen barrier, and to prevent ablation during exposure with a high-intensity laser beam.

Exemplary materials that may be used for the protective layer include those described, for example, in paragraphs [0213] to [0227] of JP 2009-255434 A (e.g., water-soluble polymer compounds and inorganic layered compounds).

<Manufacturing Method of Lithographic Printing Plate Precursor>

The lithographic printing plate precursor as above can be manufactured by combining known methods.

In particular, the lithographic printing plate precursor as above is manufactured preferably by a manufacturing method in which the following steps are performed in order.
(Surface roughening treatment step) Step of performing surface roughening treatment on an aluminum plate;
(Anodizing treatment step) Step of anodizing the aluminum plate having undergone surface roughening treatment;
(Pore-widening treatment step) Step of increasing the diameter of micropores in an anodized film obtained in the anodizing treatment step by bringing the aluminum plate having the anodized film into contact with an aqueous acid or alkali solution;
(Undercoat layer formation step) Step of forming an undercoat layer on the aluminum support obtained in the pore-widening treatment step;
(Image recording layer formation step) Step of forming an image recording layer on the undercoat layer.

The procedure of each step is described in detail below.
(Surface Roughening Treatment Step)

The surface roughening treatment step is a step in which the surface of the aluminum plate is subjected to surface roughening treatment including electrochemical graining treatment. This step is preferably performed before the anodizing treatment step to be described later but may not be performed if the aluminum plate already has a preferable surface profile.

The surface roughening treatment may include solely electrochemical graining treatment, or a combination of electrochemical graining treatment with mechanical graining treatment and/or chemical graining treatment.

When the mechanical graining treatment and the electrochemical graining treatment are combined, it is preferable that mechanical graining treatment be followed by electrochemical graining treatment.

Electrochemical graining treatment is preferably carried out in an aqueous solution containing nitric acid or hydrochloric acid as its main ingredient using direct or alternating current.

The method of mechanical graining treatment is not particularly limited and may be one described in, for example, JP 50-40047 B.

The method of chemical graining treatment is not particularly limited, either, and any known method may be employed.

Mechanical graining treatment is preferably followed by chemical etching treatment described below.

The purpose of chemical etching treatment following mechanical graining treatment is to smooth edges of irregularities at the surface of the aluminum plate to prevent ink from catching on the edges during printing, to improve scumming resistance of the lithographic printing plate, and to remove abrasive particles or other unnecessary substances remaining on the surface.

Chemical etching processes including etching using an acid and etching using an alkali are known, and an exemplary method which is particularly excellent in terms of etching efficiency includes chemical etching treatment using an alkali solution (hereinafter also called "alkali etching treatment").

Alkaline agents that may be used in the alkali solution are not particularly limited, and examples thereof include sodium hydroxide, potassium hydroxide, sodium metasilicate, sodium carbonate, sodium aluminate and sodium gluconate.

The alkaline solution may contain aluminum ions.

The alkali solution has an alkaline agent concentration of preferably not less than 0.01 wt % and more preferably not less than 3 wt %, but preferably not more than 30 wt % and more preferably not more than 25 wt %.

In cases where alkali etching treatment is carried out, chemical etching treatment using an aqueous acid solution at a low temperature (hereinafter also referred to as "desmutting treatment") is preferably carried out to remove substances produced by alkali etching treatment.

Acids that may be used in the aqueous acid solution are not particularly limited and examples thereof include sulfuric acid, nitric acid and hydrochloric acid. The aqueous acid solution preferably has an acid concentration of 1 to 50 wt %. The aqueous acid solution preferably has a temperature of 20° C. to 80° C.

For the surface roughening treatment step, the method in which the treatments shown in the following Embodiment A or B are carried out in this order is preferred.

Embodiment A (2) Chemical etching treatment using an aqueous alkali solution (first alkali etching treatment);
(3) Chemical etching treatment using an aqueous acid solution (first desmutting treatment);
(4) Electrochemical graining treatment using a nitric acid-based aqueous solution (first electrochemical graining treatment);
(5) Chemical etching treatment using an aqueous alkali solution (second alkali etching treatment);
(6) Chemical etching treatment using an aqueous acid solution (second desmutting treatment);

(7) Electrochemical graining treatment in a hydrochloric acid-based aqueous solution (second electrochemical graining treatment);
(8) Chemical etching treatment using an aqueous alkali solution (third alkali etching treatment);
(9) Chemical etching treatment using an aqueous acid solution (third desmutting treatment).

Embodiment B

(10) Chemical etching treatment using an aqueous alkali solution (fourth alkali etching treatment);
(11) Chemical etching treatment using an aqueous acid solution (fourth desmutting treatment);
(12) Electrochemical graining treatment using a hydrochloric acid-based aqueous solution (third electrochemical graining treatment);
(13) Chemical etching treatment using an aqueous alkali solution (fifth alkali etching treatment);
(14) Chemical etching treatment using an aqueous acid solution (fifth desmutting treatment).

The treatment (2) in Embodiment A or the treatment (10) in Embodiment B above may optionally be preceded by (1) mechanical graining treatment.

In the first alkali etching treatment and the fourth alkali etching treatment, the aluminum plate is dissolved in an amount of preferably 0.5 to 30 g/m$^2$ and more preferably 1.0 to 20 g/m$^2$.

For the nitric acid-based aqueous solution used in the first electrochemical graining treatment in Embodiment A, aqueous solutions used in electrochemical graining treatment involving the use of direct current or alternating current may be employed. Examples thereof include an aqueous solution prepared by adding, for instance, aluminum nitrate, sodium nitrate or ammonium nitrate to an aqueous solution having a nitric acid concentration of 1 to 100 g/L.

For the hydrochloric acid-based aqueous solution used in the second electrochemical graining treatment in Embodiment A and the third electrochemical graining treatment in Embodiment B, general aqueous solutions used in electrochemical graining treatment involving the use of direct current or alternating current may be employed. Examples thereof include an aqueous solution prepared by adding 0 to 30 g/L of sulfuric acid to an aqueous solution having a hydrochloric acid concentration of 1 to 100 g/L. To this solution, nitrate ions such as aluminum nitrate, sodium nitrate and ammonium nitrate, and chloride ions such as aluminum chloride, sodium chloride and ammonium chloride may be further added.

Sinusoidal, square, trapezoidal and triangular waveforms are applicable as an AC power source waveform for electrochemical graining treatment. The frequency is preferably from 0.1 to 250 Hz.

Figure 3:
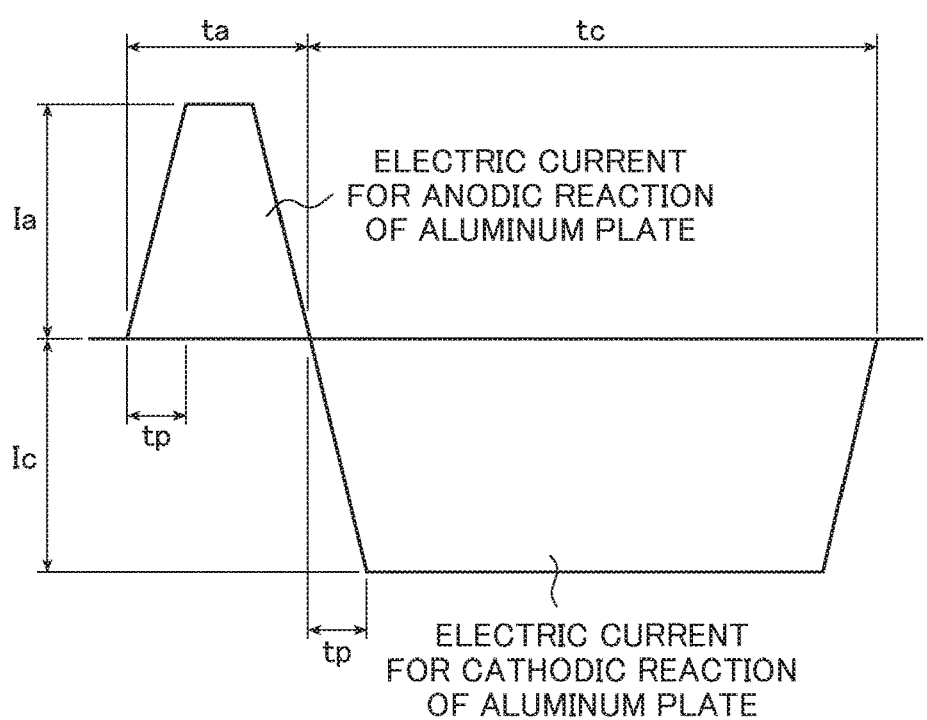
FIG. 3 is a graph showing an example of an alternating current waveform that may be used in electrochemical graining treatment in a method of manufacturing the aluminum support.

FIG. 3 is a graph showing an example of an alternating current waveform that may be used in electrochemical graining treatment.

In FIG. 3, "ta" represents the anodic reaction time, "tc" the cathodic reaction time, "tp" the time required for the current to reach a peak from zero, "Ia" the peak current on the anode cycle side, and "Ic" the peak current on the cathode cycle side. In the trapezoidal waveform, it is preferable for the time tp until the current reaches a peak from zero to be from 1 to 10 ms. One cycle of alternating current that may be used in electrochemical graining treatment preferably satisfies the following conditions: the ratio of the cathodic reaction time tc to the anodic reaction time ta in the aluminum plate (tc/ta) is from 1 to 20; the ratio of the amount of electricity Qc when the aluminum plate serves as a cathode to the amount of electricity Qa when it serves as an anode (Qc/Qa) is from 0.3 to 20; and the anodic reaction time ta is from 5 to 1,000 ms. The current density as a peak value in the trapezoidal waveform is preferably from 10 to 200 A/dm$^2$ for both of the anode cycle side value Ia and the cathode cycle side value Ic. The ratio Ic/Ia is preferably in a range of 0.3 to 20. The total amount of electricity furnished for the anodic reaction on the aluminum plate up until completion of electrochemical graining treatment is preferably from 25 to 1,000 C/dm$^2$.

Figure 4:
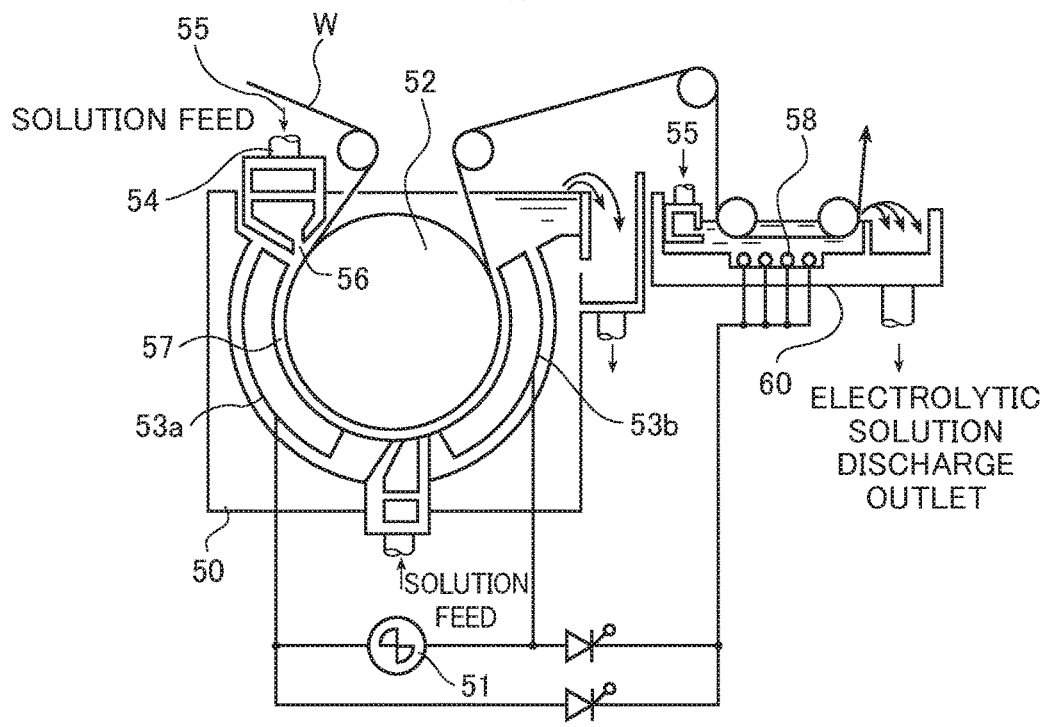
FIG. 4 is a side view showing an example of a radial cell in electrochemical graining treatment using alternating current in the method of manufacturing the aluminum support.

An apparatus shown in FIG. 4 may be used for electrochemical graining treatment using alternating current.

FIG. 4 is a side view showing an example of a radial cell in electrochemical graining treatment using alternating current.

FIG. 4 shows a main electrolytic cell 50, an AC power source 51, a radial drum roller 52, main electrodes 53a and 53b, an electrolytic solution feed inlet 54, an electrolytic solution 55, a slit 56, an electrolytic solution channel 57, auxiliary anodes 58, an auxiliary anode cell 60 and an aluminum plate W. When two or more electrolytic cells are used, electrolysis may be performed under the same or different conditions.

The aluminum plate W is wound around the radial drum roller 52 disposed to be immersed in the electrolytic solution within the main electrolytic cell 50 and is electrolyzed by the main electrodes 53a and 53b connected to the AC power source 51 as it travels. The electrolytic solution 55 is fed from the electrolytic solution feed inlet 54 through the slit 56 to the electrolytic solution channel 57 between the radial drum roller 52 and the main electrodes 53a and 53b. The aluminum plate W treated in the main electrolytic cell 50 is then electrolyzed in the auxiliary anode cell 60. In the auxiliary anode cell 60, the auxiliary anodes 58 are disposed in a face-to-face relationship with the aluminum plate W so that the electrolytic solution 55 flows through the space between the auxiliary anodes 58 and the aluminum plate W.

In the second alkali etching treatment, the aluminum plate is dissolved in an amount of preferably not less than 1.0 g/m$^2$ and more preferably 2.0 to 10 g/m$^2$ because this facilitates manufacture of a specified lithographic printing plate precursor.

In the third alkali etching treatment and the fifth alkali etching treatment, the aluminum plate is dissolved in an amount of preferably 0.01 to 0.8 g/m$^2$ and more preferably 0.05 to 0.3 g/m$^2$ because this facilitates manufacture of a specified lithographic printing plate precursor.

In chemical etching treatment in an aqueous acid solution (first to fifth desmutting treatments), phosphoric acid, nitric acid, sulfuric acid, chromic acid, hydrochloric acid or a mixed acid containing two or more thereof is advantageously used.

The aqueous acid solution preferably has an acid concentration of 0.5 to 60 wt %.

(Anodizing Treatment Step)

The procedure of the anodizing treatment step is not particularly limited as long as the micropores as described above can be obtained, and any known method may be employed.

In the anodizing treatment step, aqueous solutions of acids such as sulfuric acid, phosphoric acid and oxalic acid may be used for the electrolytic bath. The concentration of sulfuric acid is for instance from 100 to 300 g/L.

The anodizing treatment conditions are appropriately set depending on the electrolytic solution employed. Exemplary conditions are as follows: a solution temperature of from 5°

C. to 70° C. (preferably from 10° C. to 60° C.), a current density of from 0.5 to 60 A/dm$^2$ (preferably from 5 to 60 A/dm$^2$), a voltage of from 1 to 100 V (preferably from 5 to 50 V), an electrolysis time of from 1 to 100 seconds (preferably from 5 to 60 seconds), and a coating weight of from 0.1 to 5 g/m$^2$ (preferably from 0.2 to 3 g/m$^2$).

(Pore-Widening Treatment)

The pore-widening treatment is treatment for enlarging the diameter (pore size) of the micropores present in the anodized film formed by the above-described anodizing treatment step (pore size-enlarging treatment).

The pore-widening treatment can be performed by contacting the aluminum plate obtained by the above-described anodizing treatment step with an aqueous acid or alkali solution. Examples of the contacting method include, but are not limited to, immersion and spraying.

(Undercoat Layer Formation Step)

The undercoat layer formation step is a step of forming an undercoat layer on the aluminum support obtained in the pore-widening treatment step.

The undercoat layer manufacturing method is not particularly limited, and examples thereof include a method involving applying an undercoat layer-forming coating liquid containing a predetermined compound (e.g., the compound having the betaine structure) onto the anodized film on the aluminum support.

The undercoat layer-forming coating liquid preferably includes a solvent. Examples of the solvent include water and organic solvents.

For the method of applying the undercoat layer-forming coating liquid, various known application methods may be employed. Examples of such methods include bar coating, spin coating, spray coating, curtain coating, dip coating, air knife coating, blade coating and roll coating.

The coating weight (solids) of the undercoat layer is preferably from 0.1 to 100 mg/m$^2$ and more preferably from 1 to 50 mg/m$^2$.

(Image Recording Layer Formation Step)

The image recording layer formation step is a step of forming an image recording layer on the undercoat layer.

The image recording layer forming method is not particularly limited, and examples thereof include a method involving applying an image recording layer-forming coating liquid containing predetermined components (such as the infrared absorber, the polymerization initiator and the polymerizable compound as described above) onto the undercoat layer.

The image recording layer-forming coating liquid preferably includes a solvent. Examples of the solvent include water and organic solvents.

For the method of applying the image recording layer-forming coating liquid, the methods listed as exemplary methods of applying the undercoat layer-forming coating liquid may be employed.

The coating weight (solids content) of the image recording layer varies depending on the intended purpose, although an amount of 0.3 to 3.0 g/m$^2$ is generally preferred.

In cases where a protective layer is provided on the image recording layer, the protective layer forming method is not particularly limited, and examples thereof include a method involving applying an protective layer-forming coating liquid containing predetermined components onto the image recording layer.

While the embodiment in which the micropores 22$a$ in the anodized film 20$a$ have a substantially straight tubular shape is described in the foregoing, micropores may have another structure as long as the average diameter of the micropores at a surface of an anodized film falls within the predetermined range.

Figure 5:
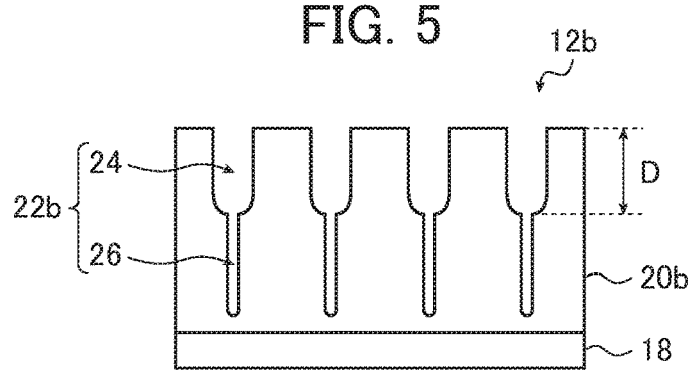
FIG. 5 is a schematic cross-sectional view of another example of the aluminum support.

For instance, as shown in FIG. 5, an embodiment may be employed in which the aluminum support 12$b$ includes the aluminum plate 18 and an anodized film 20$b$ having micropores 22$b$ each made up of a large-diameter portion 24 and a small-diameter portion 26.

Each micropore 22$b$ in the anodized film 20$b$ has the large-diameter portion 24 which extends to a depth from the anodized film surface of 10 to 1,000 nm (depth D: see FIG. 5) and the small-diameter portion 26 which communicates with the bottom of the large-diameter portion 24 and further extends to a depth from the communication position of 20 to 2,000 nm.

The large-diameter portion 24 and the small-diameter portion 26 are described below in detail.

The average diameter of the large-diameter portions 24 at the surface of the anodized film 20$b$ is more than 10 nm but not more than 100 nm, as with the average diameter of the micropores 22$a$ in the anodized film 20$a$ at the surface of the anodized film; preferred ranges thereof are also the same as those for the average diameter of the micropores 22$a$.

The measurement method of the average diameter of the large-diameter portions 24 at the surface of the anodized film 20$b$ is the same as that of the average diameter of the micropores 22$a$ in the anodized film 20$a$ at the surface of the anodized film The bottom of each large-diameter portion 24 is at a depth of 10 to 1,000 nm from the surface of the anodized film (hereinafter this depth is also referred to as "depth D"). In other words, each large-diameter portion 24 is a pore portion which extends from the surface of the anodized film in the depth direction (thickness direction) to a depth of 10 to 1,000 nm. The depth is preferably 10 to 200 nm.

The depth is determined by taking a cross-sectional image of the anodized film 20$b$ (at a magnification of 150,000×), measuring the depth of at least 25 large-diameter portions 24, and calculating the average of the measurements.

The shape of the large-diameter portions 24 is not particularly limited. Exemplary shapes include a substantially straight tubular shape (substantially columnar shape) and a conical shape in which the diameter decreases in the depth direction (thickness direction), and a substantially straight tubular shape is preferred.

As shown in FIG. 5, each small-diameter portion 26 is a pore portion which communicates with the bottom of the corresponding large-diameter portion 24 and further extends from the communication position in the depth direction (thickness direction).

The small-diameter portions 26 preferably have an average diameter of 13 nm or less at the communication position. In particular, the average diameter is preferably 11 nm or less and more preferably 10 nm or less. The lower limit thereof is not particularly limited and is usually 5 nm or more.

The average diameter of the small-diameter portions 26 is determined as follows: The surface of the anodized film 20$b$ is observed with FE-SEM at a magnification of 150,000× to obtain four images (N=4), in the resulting four images, the diameter of the micropores (small-diameter portions) within an area of 400×600 nm$^2$ is measured, and the average of the measurements is calculated. When the depth of the large-diameter portions is large, the average diameter of the small-diameter portions may be determined by cutting out the upper region of the anodized film 20$b$ (the region having the large-diameter portions) (for example, cutting out the same by argon gas) and then observing the surface of the anodized film 20b with FE-SEM, as needed.

The equivalent circle diameter is used if the shape of the small-diameter portion 26 is not circular. The "equivalent circle diameter" refers to the diameter of a circle assuming that the shape of the aperture is the circle having the same projected area as that of the aperture.

The bottom of each small-diameter portion 26 is at a distance of 20 to 2,000 nm in the depth direction from the position of communication with the corresponding large-diameter portion 24. In other words, the small-diameter portions 26 are pore portions each of which further extends in the depth direction (thickness direction) from the position of communication with the corresponding large-diameter portion 24, and the small-diameter portions 26 have a depth of 20 to 2,000 nm. The depth is preferably 500 to 1,500 nm.

The depth is determined by taking a cross-sectional image of the anodized film 20b (at a magnification of 50,000×), measuring the depth of at least 25 small-diameter portions, and calculating the average of the measurements.

The shape of the small-diameter portions 26 is not particularly limited. Exemplary shapes include a substantially straight tubular shape (substantially columnar shape) and a conical shape in which the diameter decreases in the depth direction, and a substantially straight tubular shape is preferred.

The method of manufacturing the aluminum support 12b is not particularly limited, and a manufacturing method in which the following steps are performed in order is preferred.

(Surface roughening treatment step) Step of performing surface roughening treatment on an aluminum plate;
(First anodizing treatment step) Step of anodizing the aluminum plate having undergone surface roughening treatment;
(Pore-widening treatment step) Step of increasing the diameter of micropores in an anodized film obtained in the first anodizing treatment step by bringing the aluminum plate having the anodized film into contact with an aqueous acid or alkali solution;
(Second anodizing treatment step) Step of anodizing the aluminum plate obtained in the pore-widening treatment step.

For the procedures of the steps, refer to known methods.

While the embodiment in which the undercoat layer 14 is used is described with reference to FIG. 1, the undercoat layer is not essential for the lithographic printing plate precursor as described above.

When the undercoat layer is not provided, the image recording layer may be formed after the aluminum support is subjected to hydrophilizing treatment.

Hydrophilizing treatment may be performed by the known method disclosed in paragraphs [0109] to [0114] of JP 2005-254638 A. In particular, it is preferable to perform hydrophilizing treatment by a method in which the aluminum plate is immersed in an aqueous solution of an alkali metal silicate such as sodium silicate or potassium silicate or is coated with a hydrophilic vinyl polymer or a hydrophilic compound to form a hydrophilic undercoat layer.

Hydrophilizing treatment with an aqueous solution of an alkali metal silicate such as sodium silicate or potassium silicate can be carried out according to the processes and procedures described in U.S. Pat. Nos. 2,714,066 and 3,181,461.

<Manufacturing Method of Lithographic Printing Plate>

Next, the manufacturing method of a lithographic printing plate using the lithographic printing plate precursor is described.

A typical manufacturing method of a lithographic printing plate has an exposure step in which a lithographic printing plate precursor is imagewise exposed (i.e., is subjected to image exposure) to form exposed portions and unexposed portions and a step of removing the unexposed portions of the imagewise-exposed lithographic printing plate precursor.

More specifically, one embodiment of the manufacturing method of a lithographic printing plate is a method having an exposure step in which a lithographic printing plate precursor is imagewise exposed (i.e., is subjected to image exposure) to form exposed portions and unexposed portions and a removal step of removing the unexposed portions of the lithographic printing plate precursor with a developer at a pH of 2 to 12.

Another embodiment of the manufacturing method of a lithographic printing plate is a method having an exposure step in which a lithographic printing plate precursor is imagewise exposed (i.e., is subjected to image exposure) to form exposed portions and unexposed portions and an on-press development step of removing the unexposed portions of the imagewise-exposed lithographic printing plate precursor on a printing press by supplying at least one of printing ink and fountain solution.

These embodiments are described below.

The manufacturing method of a lithographic printing plate includes a step in which the above-described lithographic printing plate precursor is imagewise exposed (i.e., is subjected to image exposure). The image exposure is carried out by exposure to a laser beam through a transparent original having, for example, a line image or a halftone dot image or by laser beam scanning using digital data.

The wavelength of a light source is preferably 750 to 1,400 nm. In the case of using a light source emitting light having a wavelength of 750 to 1,400 nm, an image recording layer containing an infrared absorber which is a sensitizing dye having an absorption in this wavelength range is preferably used.

Examples of the light source emitting light having a wavelength of 750 to 1,400 nm include a solid-state laser and semiconductor laser emitting infrared radiation. An infrared laser preferably has a power of 100 mW or more, an exposure time of up to 20 microseconds per pixel and an amount of irradiation energy of 10 to 300 $mJ/cm^2$. A multi-beam laser device is preferably used to shorten the exposure time. The exposure mechanism used may be of any of inner surface drum type, outer surface drum type and flat bed type.

The image exposure can be carried out using a platesetter or the like by an ordinary method. In the case of employing an on-press development technique to be described later, the image exposure of the lithographic printing plate precursor may be carried out on a printing press after the lithographic printing plate precursor is mounted on the printing press.

The lithographic printing plate precursor having undergone image exposure is developed by removing unexposed portions with a developer at a pH of 2 to 12 (developer treatment technique) or removing unexposed portions with at least one of printing ink and fountain solution on a printing press (on-press development technique).

(Developer Treatment Technique)

In the developer treatment technique, the lithographic printing plate precursor having undergone image exposure is treated with a developer at a pH of 2 to 14 to remove the image recording layer in unexposed portions, thereby manufacturing a lithographic printing plate.

For the developer, preferred is a developer at a pH of 5 to 10 containing at least one acid group selected from the group consisting of a phosphate group, a phosphonate group and a phosphinate group, and a compound having at least one carboxyl group (specific compound).

One exemplary method of development process is, in the case of manual treatment, a method involving fully impregnating the developer into a sponge or absorbent cotton, treating the lithographic printing plate precursor by rubbing the entire plate surface therewith, and after the completion of the treatment, thoroughly drying the precursor. In the case of immersion treatment, one exemplary method is a method involving immersing the lithographic printing plate precursor in the developer in a vat or a deep tank for about 60 seconds with stirring and then thoroughly drying the precursor while rubbing it with absorbent cotton, a sponge or the like.

In the development process, an apparatus having a simplified structure and enabling simplified steps is preferably used.

In a conventional development process, a protective layer is removed in a prior water washing step, development is subsequently carried out with an alkaline developer, thereafter alkali is removed in a posterior water washing step, gumming treatment is carried out in a gum coating step, and then drying is carried out in a drying step.

Development and gum coating can simultaneously be carried out with single liquid. For the gum, polymers are preferred, and water-soluble polymer compounds and surfactants are more preferred.

It is preferable that removal of a protection layer, development and gum coating be simultaneously carried out with single liquid without the prior water washing step. It is also preferable that, after development and gum coating, an excess developer be removed with squeeze rollers and then drying be carried out.

In this treatment, a method in which immersion into the above developer is carried out one time or two or more times may be used. In particular, a method in which immersion into the above developer is carried out one time or two times is preferred.

Immersion may be carried out by dipping the exposed lithographic printing plate precursor in the developer in a developer tank or spraying a surface of the exposed lithographic printing plate precursor with the developer using a spray or the like.

Even when immersion into the developer is carried out two or more times, if two or more immersion operations are performed with the same developer or with the developer and the developer used (exhausted developer) in which ingredients of the image recording layer is dissolved or dispersed through the development process, this is defined as the development process using a single liquid (single liquid treatment).

In the development process, a rubbing member is preferably used, and a development bath used for removing non-image portions of the image recording layer is preferably provided with the rubbing member such as a brush.

The development process may be carried out by an ordinary method, for instance, by immersing the exposed lithographic printing plate precursor in the developer at a temperature of preferably 0° C. to 60° C. and more preferably 15° C. to 40° C. and rubbing the precursor with a brush or by pumping up a treatment solution in an external tank and spraying the solution from a spray nozzle, followed by rubbing with a brush. These development processes may be carried out plural times consecutively. For example, the developer in an external tank is pumped up and sprayed from a spray nozzle, followed by rubbing with a brush; thereafter the developer may be again sprayed from the spray nozzle, followed by rubbing with the brush. When the development process is performed using an automatic development machine, the developer is fatigued with increased amount of treatment, and therefore, a replenisher or a fresh developer is preferably used to allow the treatment ability to recover.

For the development process in this disclosure, use may also be made of a gum coater and an automatic development machine that are conventionally known as the machines for treating PS plates (presensitized plates) or for use in the CTP technology. In the case of using an automatic development machine, the machine is applicable to any of a method involving pumping up a developer in a development tank or an external tank and spraying the developer from a spray nozzle, a method involving immersing a printing plate into a developer filling a tank while traveling the immersed plate by means of in-liquid guide rolls or the like, and a method involving carrying out treatment by supplying a substantially unused developer only in an amount necessary for each plate, which is a so-called disposable treatment method. In any of the methods, it is preferable to have a rubbing mechanism using, for instance, a brush or a molleton. For example, commercially available automatic development machines (Clean Out Unit C85/C125, Clean Out Unit+C85/120, FCF 85V, FCF 125V, FCF News (manufactured by Glunz & Jensen A/S); Azura CX 85, Azura CX 125, Azura CX 150 (manufactured by Agfa Graphics)) may be used. An apparatus having a laser exposure component and an automatic development machine component integrally incorporated therein may also be used.

(On-Press Development Technique)

In the on-press development technique, on a printing press, printing ink and fountain solution are supplied to the lithographic printing plate precursor having undergone image exposure to remove the image recording layer in non-image portions, thereby manufacturing a lithographic printing plate.

Specifically, the lithographic printing plate precursor is, after image exposure, directly mounted on a printing press without undergoing any type of developer treatment or is mounted on a printing press and subsequently subjected to image exposure on the printing press; the precursor is then supplied with printing ink and fountain solution for printing. As a result, in the early stage of printing, in non-image portions, the image recording layer in unexposed portions is dissolved or dispersed by the supplied printing ink and/or fountain solution and thus removed, so that a hydrophilic surface is exposed in those portions. On the other hand, in exposed portions, the image recording layer is cured by exposure to light to form oil-based ink receptive portions having a lipophilic surface. While either the printing ink or the fountain solution may be first supplied onto the plate surface, it is preferred to first supply the printing ink for the purpose of preventing the fountain solution from being contaminated with the removed ingredients of the image recording layer.

Thus, the lithographic printing plate precursor is subjected to on-press development on a printing press and used to print a large number of impressions. In other words, one embodiment of the printing method of the invention is a method having an exposure step of imagewise exposing a lithographic printing plate precursor to form exposed portions and unexposed portions and a printing step of performing printing by supplying at least one of printing ink and fountain solution to remove the unexposed portions of the imagewise-exposed lithographic printing plate precursor on a printing press.

In the method of manufacturing a lithographic printing plate from the lithographic printing plate precursor according to the invention, the entire surface of the lithographic printing plate precursor may optionally be heated before image exposure, during image exposure or in the period from image exposure to development process, regardless of the type of development technique.

EXAMPLES

The invention is described in detail by way of Examples. However, the invention should not be construed as being limited to the following Examples.

<Manufacture of Aluminum Support>

Aluminum plates (aluminum alloy plates) of material type IS with a thickness of 0.3 mm were subjected to the treatments (A) to (H) to be described below to manufacture aluminum supports. Rinsing treatment was performed between every two treatment steps, and the water remaining after rinsing treatment was removed with nip rollers.

<Treatment (A)>

(A-a) Mechanical Graining Treatment (Brush Graining)

Figure 6:
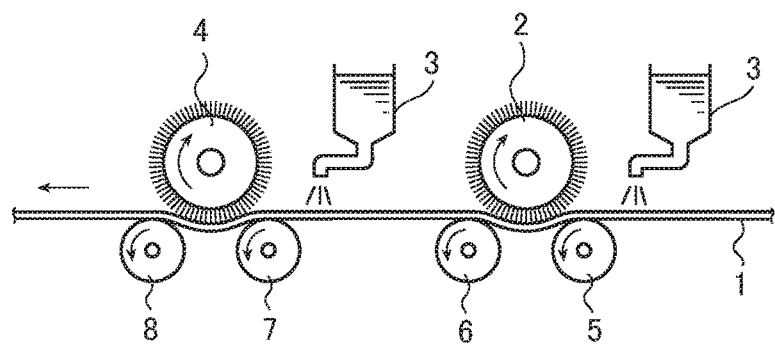
FIG. 6 is a side view conceptually showing a brush graining step used in mechanical graining treatment during manufacture of the aluminum support.

Using an apparatus as shown in FIG. 6, mechanical graining treatment was performed with rotating bristle bundle brushes while feeding an abrasive slurry in the form of a suspension of pumice (specific gravity: 1.1 g/cm$^3$) to the surface of the aluminum plate. FIG. 6 shows an aluminum plate 1, roller-type brushes (bristle bundle brushes in Examples) 2 and 4, an abrasive slurry 3, and support rollers 5, 6, 7 and 8.

Mechanical graining treatment was carried out using an abrasive having a median diameter of 30 μm with four brushes rotating at 250 rpm. The bristle bundle brushes were made of nylon 6/10 and had a bristle diameter of 0.3 mm and a bristle length of 50 mm. Each brush was constructed of a 300 mm diameter stainless steel cylinder in which holes had been formed and bristles densely set. Two support rollers (200 mm diameter) were provided below each bristle bundle brush and spaced 300 mm apart. The bristle bundle brushes were pressed against the aluminum plate until the load on the driving motor that rotates the brushes was greater by 10 kW than before the bristle bundle brushes were pressed against the plate. The direction in which the brushes were rotated was the same as the direction in which the aluminum plate was moved.

(A-b) Alkali Etching Treatment

Etching treatment was performed by using a spray to spray the aluminum plate obtained as described above with an aqueous solution having a sodium hydroxide concentration of 26 wt %, an aluminum ion concentration of 6.5 wt %, and a temperature of 70° C. The plate was then rinsed by spraying with water. The amount of dissolved aluminum was 10 g/m$^2$.

(A-c) Desmutting Treatment Using Aqueous Acid Solution

Next, desmutting treatment was performed using an aqueous nitric acid solution. Specifically, desmutting treatment was performed by spraying the aluminum plate with the aqueous nitric acid solution for 3 seconds. Nitric acid wastewater from the subsequent electrochemical graining treatment step was used for the aqueous nitric acid solution in desmutting treatment. The solution temperature was 35° C.

(A-d) Electrochemical Graining Treatment

Electrochemical graining treatment was consecutively carried out by nitric acid electrolysis using a 60 Hz AC voltage. Aluminum nitrate was added to an aqueous solution containing 10.4 g/L of nitric acid to prepare an electrolytic solution having an adjusted aluminum ion concentration of 4.5 g/L at a temperature of 35° C., and the electrolytic solution was used in this treatment. The AC power source waveform was as shown in FIG. 3, and electrochemical graining treatment was performed using an alternating current of a trapezoidal waveform with a time tp until the current reached a peak from zero of 0.8 ms and a duty ratio of 1:1 and using a carbon electrode as the counter electrode. Ferrite was used for the auxiliary anodes. An electrolytic cell of the type shown in FIG. 4 was used. The current density as a peak current value was 30 A/dm$^2$. Of the current that flowed from the power source, 5% was diverted to the auxiliary anodes. The amount of electricity (C/dm$^2$), as the total amount of electricity when the aluminum plate served as an anode, was adjusted to the amount shown in Table 1. For instance, the amount of electricity was 185 C/dm$^2$ in Example 1. The plate was then rinsed by spraying with water.

(A-e) Alkali Etching Treatment

Etching treatment was performed by using a spray to spray the aluminum plate obtained as described above with an aqueous solution having a sodium hydroxide concentration of 27 wt %, an aluminum ion concentration of 2.5 wt %, and a temperature of 50° C. The plate was then rinsed by spraying with water. The amount of dissolved aluminum was adjusted to the amount shown in Table 1. For instance, the amount of dissolved aluminum was 3.5 g/m$^2$ in Example 1.

(A-f) Desmutting Treatment Using Aqueous Acid Solution

Next, desmutting treatment was performed using an aqueous sulfuric acid solution. Specifically, desmutting treatment was performed by spraying the aluminum plate with the aqueous sulfuric acid solution for 3 seconds. The aqueous sulfuric acid solution used in desmutting treatment was an aqueous solution having a sulfuric acid concentration of 170 g/L and an aluminum ion concentration of 5 g/L. The solution temperature was 30° C.

(A-g) Electrochemical Graining Treatment

Electrochemical graining treatment was consecutively carried out by hydrochloric acid electrolysis using a 60 Hz AC voltage. Aluminum chloride was added to an aqueous solution containing 6.2 g/L of hydrochloric acid to prepare an electrolytic solution having an adjusted aluminum ion concentration of 4.5 g/L at a temperature of 35° C., and the electrolytic solution was used in this treatment. The AC power source waveform was as shown in FIG. 3, and electrochemical graining treatment was performed using an alternating current of a trapezoidal waveform with a time tp until the current reached a peak from zero of 0.8 ms and a duty ratio of 1:1 and using a carbon electrode as the counter electrode. Ferrite was used for the auxiliary anodes. An electrolytic cell of the type shown in FIG. 4 was used. The current density at the current peak was 25 A/dm$^2$. The amount of electricity (C/dm$^2$) in hydrochloric acid electrolysis, which was the total amount of electricity when the aluminum plate served as an anode, was 63 C/dm$^2$. The plate was then rinsed by spraying with water.

(A-h) Alkali Etching Treatment

Etching treatment was performed by using a spray to spray the aluminum plate obtained as described above with an aqueous solution having a sodium hydroxide concentration of 5 wt %, an aluminum ion concentration of 0.5 wt %, and a temperature of 60° C. The plate was then rinsed by spraying with water. The amount of dissolved aluminum was 0.2 g/m².

(A-i) Desmutting Treatment Using Aqueous Acid Solution

Next, desmutting treatment was performed using an aqueous sulfuric acid solution. Specifically, desmutting treatment was performed by spraying the aluminum plate with the aqueous sulfuric acid solution for 3 seconds. Specifically, the aqueous sulfuric acid solution used in desmutting treatment was wastewater generated in the anodizing treatment step (aqueous solution having a sulfuric acid concentration of 170 g/L and an aluminum ion concentration of 5 g/L). The solution temperature was 35° C.

(A-j) Anodizing Treatment

Figure 7:
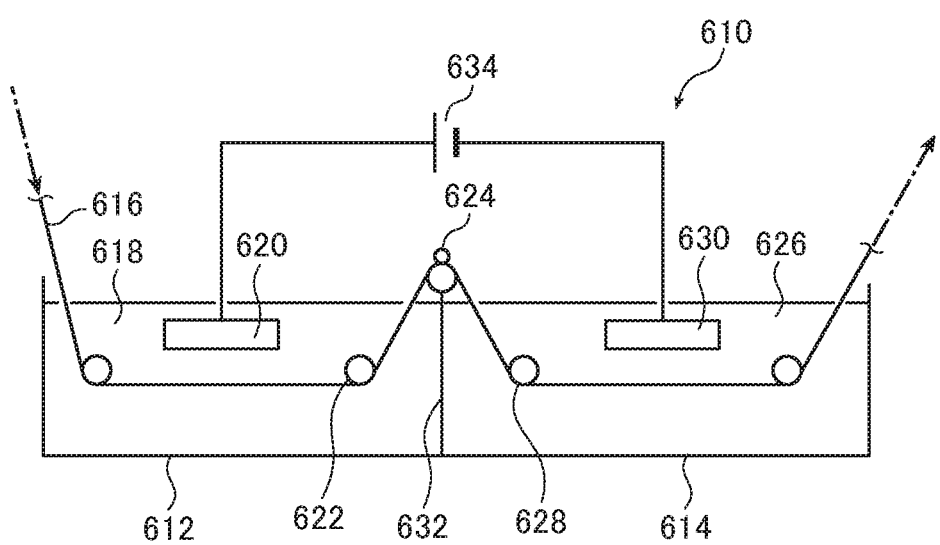
FIG. 7 is a schematic view of an anodizing apparatus that may be used in anodizing treatment during manufacture of the aluminum support.

Anodizing treatment was performed by DC electrolysis using an anodizing apparatus of the structure shown in FIG. 7. Anodizing treatment was performed under the conditions shown in the "First anodizing treatment" column of Table 1 to form the anodized film with a specified coating weight.

In an anodizing apparatus 610, an aluminum plate 616 is transported as shown by arrows in FIG. 7. The aluminum plate 616 is positively (+) charged by a power supply electrode 620 in a power supply cell 612 containing an electrolytic solution 618. The aluminum plate 616 is then transported upward by a roller 622 disposed in the power supply cell 612, turned downward by nip rollers 624, transported toward an electrolytic cell 614 containing an electrolytic solution 626 and turned to a horizontal direction by a roller 628. Then, the aluminum plate 616 was negatively (−) charged by an electrolytic electrode 630 to form an anodized film on the plate surface. The aluminum plate 616 emerging from the electrolytic cell 614 was then transported to the section for the subsequent step. In the anodizing apparatus 610, the roller 622, the nip rollers 624 and the roller 628 constituted direction changing means, and the aluminum plate 616 was transported from the power supply cell 612 to the electrolytic cell 614 in a mountain shape and a reversed U shape by means of the roller 622, the nip rollers 624 and the roller 628. The power supply electrode 620 and the electrolytic electrode 630 are connected to a DC power source 634.

(A-k) Pore-Widening Treatment

Pore-widening treatment was performed by immersing the anodized aluminum plate in an aqueous solution having a sodium hydroxide concentration of 5 wt %, an aluminum ion concentration of 0.5 wt %, and a temperature shown in Table 1 with the time condition shown in Table 1. The plate was then rinsed by spraying with water.

<Treatment (B)>

(B-a) Alkali Etching Treatment

Etching treatment was performed by using a spray to spray the aluminum plate with an aqueous solution having a sodium hydroxide concentration of 26 wt %, an aluminum ion concentration of 6.5 wt %, and a temperature of 70° C. The plate was then rinsed by spraying with water. The amount of aluminum dissolved from the surface to be subjected to electrochemical graining treatment was 5 g/m².

(B-b) Desmutting Treatment Using Aqueous Acid Solution (First Desmutting Treatment)

Next, desmutting treatment was performed using an aqueous acid solution. The aqueous acid solution used in desmutting treatment contained 150 g/L of sulfuric acid. The solution temperature was 30° C. Desmutting treatment was performed by spraying the aluminum plate with the aqueous acid solution for 3 seconds. Then, rinsing treatment was carried out.

(B-c) Electrochemical Graining Treatment

Next, electrochemical graining treatment was performed using an alternating current in an electrolytic solution having a hydrochloric acid concentration of 14 g/L, an aluminum ion concentration of 13 g/L and a sulfuric acid concentration of 3 g/L. The electrolytic solution had a temperature of 30° C. Aluminum chloride was added to adjust the aluminum ion concentration.

The alternating current had a sinusoidal waveform whose positive and negative sides were symmetric; the frequency was 50 Hz; the ratio of the anodic reaction time to the cathodic reaction time in one cycle of alternating current was 1:1; and the current density at the current peak in the AC waveform was 75 A/dm². The total amount of electricity furnished for the anodic reaction on the aluminum plate was 450 C/dm², and the aluminum plate was electrolyzed four times by separately applying 112.5 C/dm² of electricity at intervals of 4 seconds. A carbon electrode was used as the counter electrode of the aluminum plate. Then, rinsing treatment was carried out.

(B-d) Alkali Etching Treatment

Etching treatment was performed by using a spray to spray the aluminum plate having undergone electrochemical graining treatment with an aqueous solution having a sodium hydroxide concentration of 5 wt %, an aluminum ion concentration of 0.5 wt %, and a temperature of 45° C. The amount of aluminum dissolved from the surface having undergone electrochemical graining treatment was 0.2 g/m². Then, rinsing treatment was carried out.

(B-e) Desmutting Treatment Using Aqueous Acid Solution

Next, desmutting treatment was performed using an aqueous acid solution. Specifically, desmutting treatment was performed by spraying the aluminum plate with the aqueous acid solution for 3 seconds. The aqueous acid solution used in desmutting treatment was an aqueous solution having a sulfuric acid concentration of 170 g/L and an aluminum ion concentration of 5 g/L. The solution temperature was 30° C.

(B-f) Anodizing Treatment

Anodizing treatment was performed by DC electrolysis using an anodizing apparatus of the structure shown in FIG. 7. Anodizing treatment was performed under the conditions shown in the "First anodizing treatment" column of Table 1 to form the anodized film with a specified coating weight.

(B-g) Pore-Widening Treatment

Pore-widening treatment was performed by immersing the anodized aluminum plate in an aqueous solution having a sodium hydroxide concentration of 5 wt %, an aluminum ion concentration of 0.5 wt %, and a temperature of 40° C. for 3 seconds. The plate was then rinsed by spraying with water.

<Treatment (C)>

(C-a) Alkali Etching Treatment

Etching treatment was performed by using a spray to spray the aluminum plate with an aqueous solution having a sodium hydroxide concentration of 26 wt %, an aluminum ion concentration of 6.5 wt %, and a temperature of 70° C. The plate was then rinsed by spraying with water. The amount of dissolved aluminum was 5 g/m².

(C-b) Desmutting Treatment Using Aqueous Acid Solution

Next, desmutting treatment was performed using an aqueous nitric acid solution. Specifically, desmutting treatment was performed by spraying the aluminum plate with the aqueous nitric acid solution for 3 seconds. Nitric acid wastewater from the subsequent electrochemical graining treatment step was used for the aqueous nitric acid solution in desmutting treatment. The solution temperature was 35° C.

(C-c) Electrochemical Graining Treatment

Electrochemical graining treatment was consecutively carried out by nitric acid electrolysis using a 60 Hz AC voltage. Aluminum nitrate was added to an aqueous solution containing 10.4 g/L of nitric acid to prepare an electrolytic solution having an adjusted aluminum ion concentration of 4.5 g/L at a temperature of 35° C., and the electrolytic solution was used in this treatment. The AC power source waveform was as shown in FIG. 3, and electrochemical graining treatment was performed using an alternating current of a trapezoidal waveform with a time tp until the current reached a peak from zero of 0.8 ms and a duty ratio of 1:1 and using a carbon electrode as the counter electrode. Ferrite was used for the auxiliary anodes. An electrolytic cell of the type shown in FIG. 4 was used. The current density as a peak current value was 30 A/dm$^2$. Of the current that flowed from the power source, 5% was diverted to the auxiliary anodes. The amount of electricity (C/dm$^2$), as the total amount of electricity when the aluminum plate served as an anode, was 230 C/dm$^2$. The plate was then rinsed by spraying with water.

(C-d) Alkali Etching Treatment

Etching treatment was performed by using a spray to spray the aluminum plate obtained as described above with an aqueous solution having a sodium hydroxide concentration of 27 wt %, an aluminum ion concentration of 2.5 wt %, and a temperature of 50° C. The plate was then rinsed by spraying with water. The amount of dissolved aluminum was 3.5 g/m$^2$.

(C-e) Desmutting Treatment Using Aqueous Acid Solution

Next, desmutting treatment was performed using an aqueous sulfuric acid solution. Specifically, desmutting treatment was performed by spraying the aluminum plate with the aqueous sulfuric acid solution for 3 seconds. The aqueous sulfuric acid solution used in desmutting treatment was an aqueous solution having a sulfuric acid concentration of 170 g/L and an aluminum ion concentration of 5 g/L. The solution temperature was 30° C.

(C-f) Electrochemical Graining Treatment

Electrochemical graining treatment was consecutively carried out by hydrochloric acid electrolysis using a 60 Hz AC voltage. Aluminum chloride was added to an aqueous solution containing 6.2 g/L of hydrochloric acid to prepare an electrolytic solution having an adjusted aluminum ion concentration of 4.5 g/L at a temperature of 35° C., and the electrolytic solution was used in this treatment. The AC power source waveform was as shown in FIG. 3, and electrochemical graining treatment was performed using an alternating current of a trapezoidal waveform with a time tp until the current reached a peak from zero of 0.8 ms and a duty ratio of 1:1 and using a carbon electrode as the counter electrode. Ferrite was used for the auxiliary anodes. An electrolytic cell of the type shown in FIG. 4 was used. The current density at the current peak was 25 A/dm$^2$. The amount of electricity (C/dm$^2$) in hydrochloric acid electrolysis, which was the total amount of electricity when the aluminum plate served as an anode, was 63 C/dm$^2$. The plate was then rinsed by spraying with water.

(C-g) Alkali Etching Treatment

Etching treatment was performed by using a spray to spray the aluminum plate obtained as described above with an aqueous solution having a sodium hydroxide concentration of 5 wt %, an aluminum ion concentration of 0.5 wt %, and a temperature of 60° C. The plate was then rinsed by spraying with water. The amount of dissolved aluminum was 0.2 g/m$^2$.

(C-h) Desmutting Treatment Using Aqueous Acid Solution

Next, desmutting treatment was performed using an aqueous sulfuric acid solution. Specifically, desmutting treatment was performed by spraying the aluminum plate with the aqueous sulfuric acid solution for 3 seconds. The aqueous sulfuric acid solution used in desmutting treatment was an aqueous solution having a sulfuric acid concentration of 170 g/L and an aluminum ion concentration of 5 g/L. The solution temperature was 35° C.

(C-i) Anodizing Treatment

Anodizing treatment was performed by DC electrolysis using an anodizing apparatus of the structure shown in FIG. 7. Anodizing treatment was performed under the conditions shown in the "First anodizing treatment" column of Table 1 to form the anodized film with a specified coating weight.

(C-j) Pore-Widening Treatment

Pore-widening treatment was performed by immersing the anodized aluminum plate in an aqueous solution having a sodium hydroxide concentration of 5 wt %, an aluminum ion concentration of 0.5 wt %, and a temperature of 40° C. for 3 seconds. The plate was then rinsed by spraying with water.

<Treatment (D)>

(D-a) Alkali Etching Treatment

Etching treatment was performed by using a spray to spray the aluminum plate with an aqueous solution having a sodium hydroxide concentration of 26 wt %, an aluminum ion concentration of 6.5 wt %, and a temperature of 70° C. The plate was then rinsed by spraying with water. The amount of aluminum dissolved from the surface to be subjected to electrochemical graining treatment was 5 g/m$^2$.

(D-b) Desmutting Treatment Using Aqueous Acid Solution

Next, desmutting treatment was performed using an aqueous acid solution. Specifically, desmutting treatment was performed by spraying the aluminum plate with the aqueous acid solution for 3 seconds. The aqueous acid solution used in desmutting treatment contained 150 g/L of sulfuric acid. The solution temperature was 30° C.

(D-c) Electrochemical Graining Treatment

Next, electrochemical graining treatment was performed using an alternating current in an electrolytic solution having a hydrochloric acid concentration of 14 g/L, an aluminum ion concentration of 13 g/L and a sulfuric acid concentration of 3 g/L. The electrolytic solution had a temperature of 30° C. Aluminum chloride was added to adjust the aluminum ion concentration.

The alternating current had a sinusoidal waveform whose positive and negative sides were symmetric; the frequency was 50 Hz; the ratio of the anodic reaction time to the cathodic reaction time in one cycle of alternating current was 1:1; and the current density at the current peak in the AC waveform was 75 A/dm$^2$. The total amount of electricity furnished for the anodic reaction on the aluminum plate was 450 C/dm$^2$, and the aluminum plate was electrolyzed four times by separately applying 112.5 C/dm$^2$ of electricity at intervals of 4 seconds. A carbon electrode was used as the counter electrode of the aluminum plate. Then, rinsing treatment was carried out.

(D-d) Alkali Etching Treatment

Etching treatment was performed by using a spray to spray the aluminum plate having undergone electrochemical graining treatment with an aqueous solution having a sodium hydroxide concentration of 5 wt %, an aluminum ion concentration of 0.5 wt %, and a temperature of 45° C. The amount of aluminum dissolved from the surface having undergone electrochemical graining treatment was 0.2 g/m$^2$. Then, rinsing treatment was carried out.

(D-e) Desmutting Treatment Using Aqueous Acid Solution

Next, desmutting treatment was performed using an aqueous acid solution. Specifically, desmutting treatment was performed by spraying the aluminum plate with the aqueous acid solution for 3 seconds. The aqueous acid solution used in desmutting treatment was an aqueous solution having a sulfuric acid concentration of 170 g/L and an aluminum ion concentration of 5 g/L. The solution temperature was 35° C.

(D-f) First Anodizing Treatment

First anodizing treatment was performed by DC electrolysis using an anodizing apparatus of the structure shown in FIG. 7. Anodizing treatment was performed under the conditions shown in the "First anodizing treatment" column of Table 1 to form the anodized film with a specified coating weight.

(D-g) Pore-Widening Treatment

Pore-widening treatment was performed by immersing the anodized aluminum plate in an aqueous solution having a sodium hydroxide concentration of 5 wt %, an aluminum ion concentration of 0.5 wt %, and a temperature of 40° C. with the time condition shown in Table 1. The plate was then rinsed by spraying with water.

(D-h) Second Anodizing Treatment

Second anodizing treatment was performed by DC electrolysis using an anodizing apparatus of the structure shown in FIG. 7. Anodizing treatment was performed under the conditions shown in the "Second anodizing treatment" column of Table 1 to form the anodized film with a specified coating weight.

<Treatment (E)>

(E-a) Alkali Etching Treatment

Etching treatment was performed by using a spray to spray the aluminum plate with an aqueous solution having a sodium hydroxide concentration of 26 wt %, an aluminum ion concentration of 6.5 wt %, and a temperature of 70° C. The plate was then rinsed by spraying with water. The amount of aluminum dissolved from the surface to be subjected to electrochemical graining treatment was 5 g/m$^2$.

(E-b) Desmutting Treatment Using Aqueous Acid Solution

Next, desmutting treatment was performed using an aqueous acid solution. Specifically, desmutting treatment was performed by spraying the aluminum plate with the aqueous acid solution for 3 seconds. The aqueous acid solution used in desmutting treatment contained 150 g/L of sulfuric acid. The solution temperature was 30° C.

(E-c) Electrochemical Graining Treatment

Next, electrochemical graining treatment was performed using an alternating current in an electrolytic solution having a hydrochloric acid concentration of 14 g/L, an aluminum ion concentration of 13 g/L and a sulfuric acid concentration of 3 g/L. The electrolytic solution had a temperature of 30° C. Aluminum chloride was added to adjust the aluminum ion concentration.

The alternating current had a sinusoidal waveform whose positive and negative sides were symmetric; the frequency was 50 Hz; the ratio of the anodic reaction time to the cathodic reaction time in one cycle of alternating current was 1:1; and the current density at the current peak in the AC waveform was 75 A/dm$^2$. The total amount of electricity furnished for the anodic reaction on the aluminum plate was 450 C/dm$^2$, and the aluminum plate was electrolyzed four times by separately applying 112.5 C/dm$^2$ of electricity at intervals of 4 seconds. A carbon electrode was used as the counter electrode of the aluminum plate. Then, rinsing treatment was carried out.

(E-d) Alkali Etching Treatment

Etching treatment was performed by using a spray to spray the aluminum plate having undergone electrochemical graining treatment with an aqueous solution having a sodium hydroxide concentration of 5 wt %, an aluminum ion concentration of 0.5 wt %, and a temperature of 45° C. The amount of aluminum dissolved from the surface having undergone electrochemical graining treatment was 0.2 g/m$^2$. Then, rinsing treatment was carried out.

(E-e) Desmutting Treatment Using Aqueous Acid Solution

Next, desmutting treatment was performed using an aqueous acid solution. Specifically, desmutting treatment was performed by spraying the aluminum plate with the aqueous acid solution for 3 seconds. The aqueous acid solution used in desmutting treatment was an aqueous solution having a sulfuric acid concentration of 170 g/L and an aluminum ion concentration of 5 g/L. The solution temperature was 35° C.

(E-f) First Anodizing Treatment

First anodizing treatment was performed by DC electrolysis using an anodizing apparatus of the structure shown in FIG. 7. Anodizing treatment was performed under the conditions shown in the "First anodizing treatment" column of Table 1 to form the anodized film with a specified coating weight.

<Treatment (F)>

(F-a) Alkali Etching Treatment

Etching treatment was performed by using a spray to spray the aluminum plate with an aqueous solution having a sodium hydroxide concentration of 26 wt %, an aluminum ion concentration of 6.5 wt %, and a temperature of 70° C. The plate was then rinsed by spraying with water. The amount of aluminum dissolved from the surface to be subjected to electrochemical graining treatment was 5 g/m$^2$.

(F-b) Desmutting Treatment Using Aqueous Acid Solution

Next, desmutting treatment was performed using an aqueous acid solution. Specifically, desmutting treatment was performed by spraying the aluminum plate with the aqueous acid solution for 3 seconds. The aqueous acid solution used in desmutting treatment contained 150 g/L of sulfuric acid. The solution temperature was 30° C.

(F-c) Electrochemical Graining Treatment

Next, electrochemical graining treatment was performed using an alternating current in an electrolytic solution having a hydrochloric acid concentration of 14 g/L, an aluminum ion concentration of 13 g/L and a sulfuric acid concentration of 3 g/L. The electrolytic solution had a temperature of 30° C. Aluminum chloride was added to adjust the aluminum ion concentration.

The alternating current had a sinusoidal waveform whose positive and negative sides were symmetric; the frequency was 50 Hz; the ratio of the anodic reaction time to the cathodic reaction time in one cycle of alternating current was 1:1; and the current density at the current peak in the AC waveform was 75 A/dm$^2$. The total amount of electricity furnished for the anodic reaction on the aluminum plate was 450 C/dm$^2$, and the aluminum plate was electrolyzed four times by separately applying 112.5 C/dm$^2$ of electricity at intervals of 4 seconds. A carbon electrode was used as the counter electrode of the aluminum plate. Then, rinsing treatment was carried out.

(F-d) Alkali Etching Treatment

Etching treatment was performed by using a spray to spray the aluminum plate having undergone electrochemical graining treatment with an aqueous solution having a sodium hydroxide concentration of 5 wt %, an aluminum ion concentration of 0.5 wt %, and a temperature of 45° C. The amount of aluminum dissolved from the surface having undergone electrochemical graining treatment was 0.2 g/m². Then, rinsing treatment was carried out.

(F-e) Desmutting Treatment Using Aqueous Acid Solution

Next, desmutting treatment was performed using an aqueous acid solution. Specifically, desmutting treatment was performed by spraying the aluminum plate with the aqueous acid solution for 3 seconds. The aqueous acid solution used in desmutting treatment was an aqueous solution having a sulfuric acid concentration of 170 g/L and an aluminum ion concentration of 5 g/L. The solution temperature was 35° C.

(F-f) First Anodizing Treatment

First anodizing treatment was performed by DC electrolysis using an anodizing apparatus of the structure shown in FIG. 7. Anodizing treatment was performed under the conditions shown in the "First anodizing treatment" column of Table 1 to form the anodized film with a specified coating weight.

(F-g) Second Anodizing Treatment

Second anodizing treatment was performed by DC electrolysis using an anodizing apparatus of the structure shown in FIG. 7. Anodizing treatment was performed under the conditions shown in the "Second anodizing treatment" column of Table 1 to form the anodized film with a specified coating weight.

<Treatment (G)>

(G-a) Alkali Etching Treatment

Etching treatment was performed by using a spray to spray the aluminum plate with an aqueous solution having a sodium hydroxide concentration of 26 wt %, an aluminum ion concentration of 6.5 wt %, and a temperature of 70° C. The plate was then rinsed by spraying with water. The amount of aluminum dissolved from the surface to be subjected to electrochemical graining treatment was 5 g/m².

(G-b) Desmutting Treatment Using Aqueous Acid Solution

Next, desmutting treatment was performed using an aqueous acid solution. Specifically, desmutting treatment was performed by spraying the aluminum plate with the aqueous acid solution for 3 seconds. The aqueous acid solution used in desmutting treatment contained 150 g/L of sulfuric acid. The solution temperature was 30° C.

(G-c) Electrochemical Graining Treatment

Next, electrochemical graining treatment was performed using an alternating current in an electrolytic solution having a hydrochloric acid concentration of 14 g/L, an aluminum ion concentration of 13 g/L and a sulfuric acid concentration of 3 g/L. The electrolytic solution had a temperature of 30° C. Aluminum chloride was added to adjust the aluminum ion concentration.

The alternating current had a sinusoidal waveform whose positive and negative sides were symmetric; the frequency was 50 Hz; the ratio of the anodic reaction time to the cathodic reaction time in one cycle of alternating current was 1:1; and the current density at the current peak in the AC waveform was 75 A/dm². The total amount of electricity furnished for the anodic reaction on the aluminum plate was 450 C/dm², and the aluminum plate was electrolyzed four times by separately applying 112.5 C/dm² of electricity at intervals of 4 seconds. A carbon electrode was used as the counter electrode of the aluminum plate. Then, rinsing treatment was carried out.

(G-d) Alkali Etching Treatment

Etching treatment was performed by using a spray to spray the aluminum plate having undergone electrochemical graining treatment with an aqueous solution having a sodium hydroxide concentration of 5 wt %, an aluminum ion concentration of 0.5 wt %, and a temperature of 45° C. The amount of aluminum dissolved from the surface having undergone electrochemical graining treatment was 0.2 g/m². Then, rinsing treatment was carried out.

(G-e) Desmutting Treatment Using Aqueous Acid Solution

Next, desmutting treatment was performed using an aqueous acid solution. Specifically, desmutting treatment was performed by spraying the aluminum plate with the aqueous acid solution for 3 seconds. The aqueous acid solution used in desmutting treatment was an aqueous solution having a sulfuric acid concentration of 170 g/L and an aluminum ion concentration of 5 g/L. The solution temperature was 35° C.

(G-f) First Anodizing Treatment

First anodizing treatment was performed by DC electrolysis using an anodizing apparatus of the structure shown in FIG. 7. Anodizing treatment was performed under the conditions shown in the "First anodizing treatment" column of Table 1 to form the anodized film with a specified coating weight.

(G-g) Pore-Widening Treatment

Pore-widening treatment was performed by immersing the anodized aluminum plate in an aqueous solution having a sodium hydroxide concentration of 5 wt %, an aluminum ion concentration of 0.5 wt %, and a temperature of 40° C. with the time condition shown in Table 1. The plate was then rinsed by spraying with water.

(G-h) Second Anodizing Treatment

Second anodizing treatment was performed by DC electrolysis using an anodizing apparatus of the structure shown in FIG. 7. Anodizing treatment was performed under the conditions shown in the "Second anodizing treatment" column of Table 1 to form the anodized film with a specified coating weight.

<Treatment (H)>

(H-a) Alkali Etching Treatment

Etching treatment was performed by using a spray to spray the aluminum plate with an aqueous solution having a sodium hydroxide concentration of 26 wt %, an aluminum ion concentration of 6.5 wt %, and a temperature of 70° C. The plate was then rinsed by spraying with water. The amount of aluminum dissolved from the surface to be subjected to electrochemical graining treatment was 5 g/m².

(H-b) Desmutting Treatment Using Aqueous Acid Solution

Next, desmutting treatment was performed using an aqueous acid solution. Specifically, desmutting treatment was performed by spraying the aluminum plate with the aqueous acid solution for 3 seconds. The aqueous acid solution used in desmutting treatment contained 150 g/L of sulfuric acid. The solution temperature was 30° C.

(H-c) Electrochemical Graining Treatment

Next, electrochemical graining treatment was performed using an alternating current in an electrolytic solution having a hydrochloric acid concentration of 14 g/L, an aluminum ion concentration of 13 g/L and a sulfuric acid concentration of 3 g/L. The electrolytic solution had a temperature of 30° C. Aluminum chloride was added to adjust the aluminum ion concentration.

The alternating current had a sinusoidal waveform whose positive and negative sides were symmetric; the frequency was 50 Hz; the ratio of the anodic reaction time to the cathodic reaction time in one cycle of alternating current was 1:1; and the current density at the current peak in the AC waveform was 75 A/dm². The total amount of electricity furnished for the anodic reaction on the aluminum plate was 450 C/dm², and the aluminum plate was electrolyzed four times by separately applying 112.5 C/dm² of electricity at intervals of 4 seconds. A carbon electrode was used as the counter electrode of the aluminum plate. Then, rinsing treatment was carried out.

(H-d) Alkali Etching Treatment

Etching treatment was performed by using a spray to spray the aluminum plate having undergone electrochemical graining treatment with an aqueous solution having a sodium hydroxide concentration of 5 wt %, an aluminum ion concentration of 0.5 wt %, and a temperature of 45° C. The amount of aluminum dissolved from the surface having undergone electrochemical graining treatment was 0.2 g/m². Then, rinsing treatment was carried out.

(H-e) Desmutting Treatment Using Aqueous Acid Solution

Next, desmutting treatment was performed using an aqueous acid solution. Specifically, desmutting treatment was performed by spraying the aluminum plate with the aqueous acid solution for 3 seconds. The aqueous acid solution used in desmutting treatment was an aqueous solution having a sulfuric acid concentration of 170 g/L and an aluminum ion concentration of 5 g/L. The solution temperature was 35° C.

(H-f) First Anodizing Treatment

First anodizing treatment was performed by DC electrolysis using an anodizing apparatus of the structure shown in FIG. 7. Anodizing treatment was performed under the conditions shown in the "First anodizing treatment" column of Table 1 to form the anodized film with a specified coating weight.

(H-g) Second Anodizing Treatment

Second anodizing treatment was performed by DC electrolysis using an anodizing apparatus of the structure shown in FIG. 7. Anodizing treatment was performed under the conditions shown in the "Second anodizing treatment" column of Table 1 to form the anodized film with a specified coating weight.

The average diameter at the surface of the anodized film obtained as described above on the opposite side from the aluminum plate side is shown in Table 2.

The average diameter of the micropores was determined as follows: The surface was observed with FE-SEM at a magnification of 150,000× to obtain four images (N=4), in the resulting four images, the diameter of the micropores within an area of 400×600 nm² was measured at 50 places, and the average of the measurements was calculated.

The equivalent circle diameter was used if the shape of the micropores was not circular. The "equivalent circle diameter" refers to the diameter of a circle assuming that the shape of the aperture is the circle having the same projected area as that of the aperture.

The micropores in the anodized films obtained in Examples 1 to 25 had a depth of from about 10 to about 3,000 nm.

For Examples 26 to 29, the average diameter of the large-diameter portions at the surface of the anodized film, the average diameter of the small-diameter portions at their communication positions and the depths of the large-diameter portions and the small-diameter portions in the micropore-bearing anodized film after the second anodizing treatment step are collectively shown in Table 3.

The average diameters of the micropores (average diameter of the large-diameter portions and that of the small-diameter portions) were determined as follows: The anodized film showing the aperture surfaces of the large-diameter portions and those of the small-diameter portions was observed with FE-SEM at a magnification of 150,000× to obtain four images (N=4), in the resulting four images, the diameter of the micropores (large-diameter portions and small-diameter portions) within an area of 400×600 nm² was measured at 50 places, and the average of the measurements was calculated. When it was difficult to measure the diameter of the small-diameter portions because of the large depth of the large-diameter portions, the upper portion of the anodized film was cut out to determine the various diameters.

The depths of the micropores (the depth of the large-diameter portions and that of the small-diameter portions) were determined as follows: The cross-sectional surface of the support (anodized film) was observed with FE-SEM (at a magnification of 150,000× to observe the depth of the large-diameter portions and at a magnification of 50,000× to observe the depth of the small-diameter portions), and in the resulting images, the depth of arbitrarily selected 25 micropores was measured, and the average of the measurements was calculated.

The lightness L* in the L*a*b* color system, the steepness a45 and the specific surface area ΔS of the surface of the anodized film (the surface of the anodized film on the opposite side from the aluminum plate side) in the resulting aluminum support were calculated by the methods described above.

<Undercoat Layer-Forming Treatment or Hydrophilizing Treatment>

As shown in Table 1, the surface of the anodized film of the aluminum support manufactured through the foregoing treatment was subjected to one of treatments A to C.

(Treatment A)

An undercoat layer-forming coating liquid 1 was applied onto the aluminum support to a dry coating weight of 20 mg/m² to thereby form an undercoat layer.

The undercoat layer-forming coating liquid 1 contained a polymer (0.5 g) represented by the structural formula below and water (500 g). The value at the lower right of brackets of each constitutional unit is of weight percent.

[Chemical Formula 9]

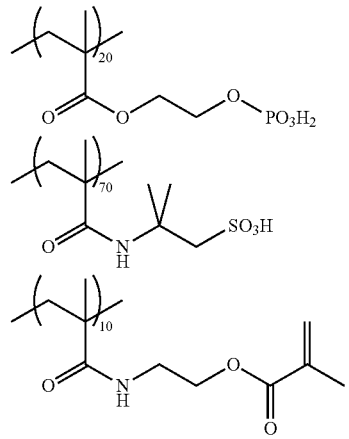

(Treatment B)

The aluminum support was immersed in an aqueous solution containing 4 g/L of polyvinylphosphonic acid (pH=1.9) at 40° C. for 10 seconds. Thereafter, the aluminum support was taken out, rinsed with demineralized water containing calcium ions at 20° C. for 2 seconds and dried. After this process, the amount of P and the amount of Ca on the aluminum support were 25 mg/m² and 1.9 mg/m², respectively.

(Treatment C)

An undercoat layer-forming coating liquid 2 was applied onto the aluminum support to a dry coating weight of 20 mg/m² to thereby form an undercoat layer.

The undercoat layer-forming coating liquid 2 contained a polymer (0.5 g) represented by the structural formula below and water (500 g). The value at the lower right of brackets of each constitutional unit is of weight percent.

[Chemical Formula 10]

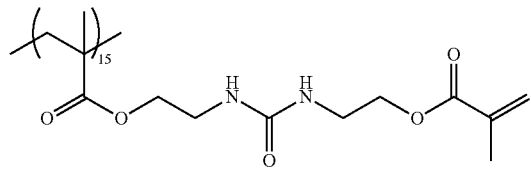

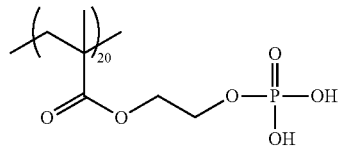

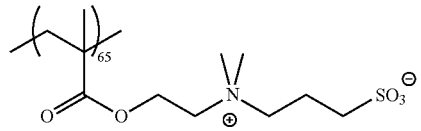

Mw 150.000

<Formation of Image Recording Layer>

As shown in Table 1, an image recording layer A or B was formed on the aluminum support having undergone the <undercoat layer-forming treatment or hydrophilizing treatment> (or the aluminum support having not undergone the <undercoat layer-forming treatment or hydrophilizing treatment> in Example 23).

The methods of forming the image recording layers are as follows.

<Formation Method of Image Recording Layer A>

An image recording layer-forming coating liquid A of the composition shown below was applied on the aluminum support by bar coating and dried in an oven at 100° C. for 60 seconds to thereby form an image recording layer having a dry coating weight of 1.0 g/m².

The image recording layer-forming coating liquid A was obtained by mixing with stirring the photosensitive solution (1) and the microgel solution (1) described below just before use in application.

<Photosensitive Solution (1)>
  Binder polymer (1) [its structure is shown below] 0.240 g
  Infrared absorbing dye (1) [its structure is shown below] 0.030 g
  Polymerization initiator (1) [its structure is shown below] 0.162 g
  Radical polymerizable compound
    Tris(acryloyloxyethyl)isocyanurate
    (NK ester A-9300, manufactured by Shin-Nakamura Chemical Corporation) 0.192 g
  Low-molecular-weight hydrophilic compound
    Tris(2-hydroxyethyl) isocyanurate 0.062 g
  Low-molecular-weight hydrophilic compound (1) [its structure is shown below] 0.050 g
  Ink receptivity enhancer Phosphonium compound (1) [its structure is shown below] 0.055 g
  Ink receptivity enhancer
    Benzyl-dimethyl-octyl ammonium.PF$^6$ salt 0.018 g
  Ink receptivity enhancer Ammonium group-bearing polymer [its structure is shown below; reduced specific viscosity, 44 ml/g] 0.035 g
  Fluorosurfactant (1) [its structure is shown below] 0.008 g
  2-Butanone 1.091 g
  1-Methoxy-2-propanol 8.609 g <Microgel Solution (1)>
  Microgel (1) 2.640 g
  Distilled water 2.425 g The binder polymer (1), the infrared absorber (1), the polymerization initiator (1), the phosphonium compound (1), the low-molecular-weight hydrophilic compound (1), the ammonium group-bearing polymer and the fluorosurfactant (1) have the structures represented by the following formulae.

[Chemical Formula 11]

Binder polymer (1)

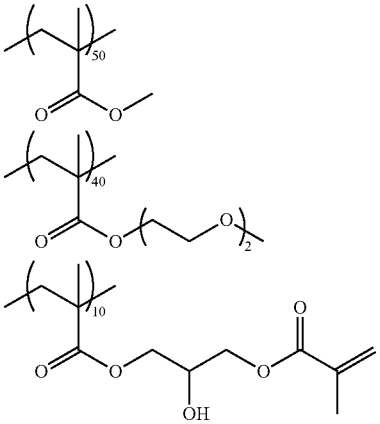

(Mw 70.000)

Ammonium group-bearing polymer

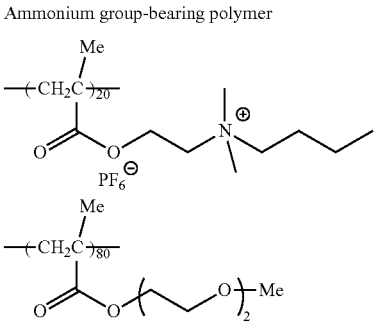

Me represents a methyl group, and the value at the lower right of brackets of each constitutional unit of the binder polymer (1) and the ammonium group-bearing polymer represents a molar ratio.

[Chemical Formula 12]

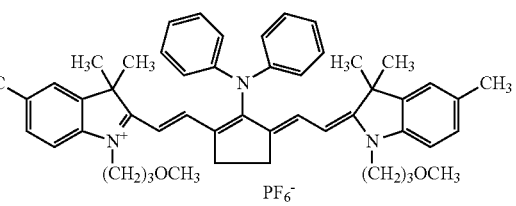

Infrared absorber (1)

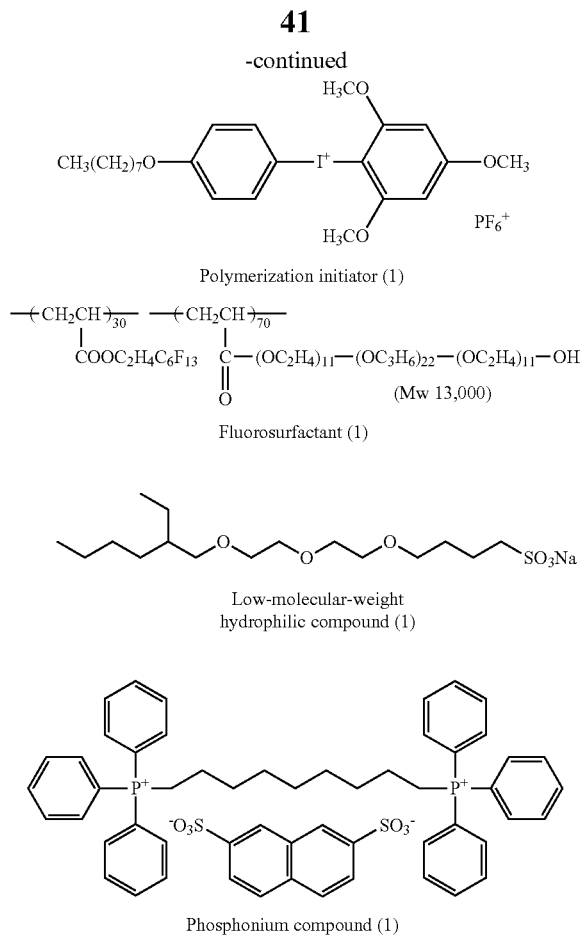

Polymerization initiator (1)

Fluorosurfactant (1) (Mw 13,000)

Low-molecular-weight hydrophilic compound (1)

Phosphonium compound (1)

—Synthesis of Microgel (1)—

An oil phase component was obtained by dissolving 4.46 g of polyfunctional isocyanate having the structure below (manufactured by Mitsui Chemicals, Inc.; 75 wt % ethyl acetate solution), 10 g of an adduct obtained by adding trimethylolpropane (6 mol) and xylene diisocyanate (18 mol) and adding thereto polyoxyethylene terminated by methyl at one end (1 mol; the number of oxyethylene repeating units: 90) (manufactured by Mitsui Chemicals, Inc.; 50 wt % ethyl acetate solution), 3.1.5 g of pentaerythritol triacrylate (SR444, manufactured by Nippon Kayaku Co., Ltd.) and 0.1 g of Pionin A-41C (manufactured by Takemoto Oil & Fat Co., Ltd.) in 17 g of ethyl acetate. An aqueous phase component was obtained by preparing 40 g of 4 wt % aqueous solution of polyvinyl alcohol (PVA-205, manufactured by Kuraray Co., Ltd.).

The oil phase component and the aqueous phase component were mixed and emulsified in a homogenizer at 12,000 rpm for 10 minutes. The resulting emulsion was added to 25 g of distilled water, and the obtained solution was stirred at room temperature for 30 minutes and then at 50° C. for 3 hours. The thus obtained microgel was diluted with distilled water to have a solids concentration of 15 wt % and used as the microgel (1). The average particle size of the microgel (1) measured by a light scattering method was 0.2 μm.

[Chemical Formula 13]

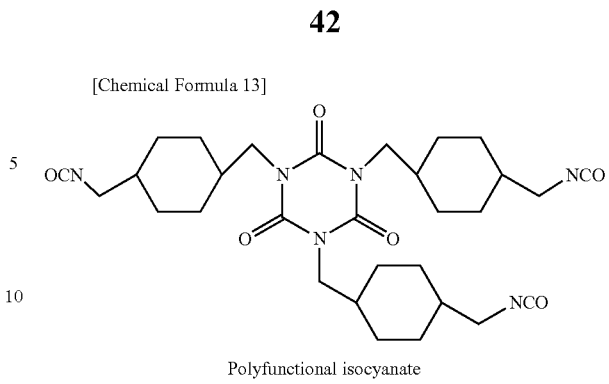

Polyfunctional isocyanate (Formation Method of Image Recording Layer B)

An image recording layer-forming coating liquid B of the composition shown below was applied on the aluminum support and dried at 50° C. for 60 seconds to thereby form an image recording layer having a dry coating weight of 1.0 g/m².

The image recording layer-forming coating liquid B contained thermoplastic resin particles, an infrared absorber IR-01, polyacrylic acid and a surfactant, and had a pH of 3.6.
Thermoplastic resin particles: Styrene/acrylonitrile copolymer (molar ratio 50/50); average particle size, 61 nm Infrared absorber IR-01: Infrared absorber having the structure below (Et represents an ethyl group)

[Chemical Formula 14]

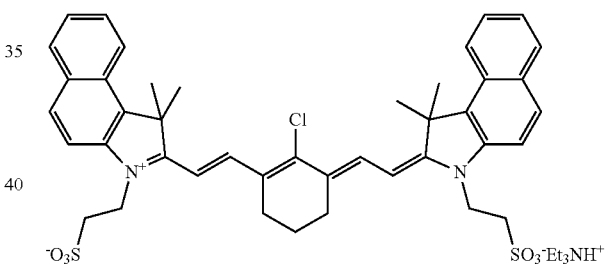

IR-01

Polyacrylic acid: Weight-average molecular weight of 250,000
Surfactant: Zonyl FSO 100 (manufactured by E. I. du Pont de Nemours and Company)
The foregoing components are applied in amounts as stated below.
Thermoplastic resin particles: 0.69 (g/m²)
Infrared absorber IR-01: $1.03 \times 10^{-4}$ (mol/m²)
Polyacrylic acid: 0.09 (g/m²)
Surfactant: 0.0075 (g/m²)
(Formation Method of Image Recording Layer C)
An image recording layer-forming coating liquid C of the composition shown below was applied on the aluminum support by bar coating and dried in an oven at 100° C. for 60 seconds to thereby form an image recording layer having a dry coating weight of 1.0 g/m².
<Image Recording Layer-Forming Coating Liquid C>
Polymerizable compound 1: 0.15 parts by weight
Polymerizable compound 2: 0.1 parts by weight
Graft copolymer 2: 0.825 parts by weight
Klucel M (manufactured by Hercules Incorporated): 0.020 parts by weight Irgacure 250 (manufactured by BASF): 0.032 parts by weight
Infrared absorber (1): 0.02 parts by weight
Sodium tetraphenylborate: 0.03 parts by weight
BYK 336 (manufactured by BYK-Chemie): 0.015 parts by weight
Black-XV (Yamamoto Chemicals, Inc.): 0.04 parts by weight
n-Propanol: 7.470 parts by weight
Water: 1.868 parts by weight
Polymerizable compound 1: UA510H (manufactured by Kyoeisha Chemical Co., Ltd.; reaction product of dipentaerythritol pentaacrylate and hexamethylene diisocyanate)
Polymerizable compound 2: ATM-4E (manufactured by Shin Nakamura Chemical Co., Ltd.; ethoxylated pentaerythritol tetraacrylate) Graft copolymer 2: This is polymer particles of graft copolymer with poly(ethylene glycol) methyl ether methacrylate/styrene/acrylonitrile=10:9:81, more specifically, a dispersion containing 24 wt % of the polymer particles in a solvent having n-propanol and water in a weight ratio of 80/20. The volume average particle size thereof is 193 nm.
Infrared absorber (1): Compound below

[Chemical Formula 15]

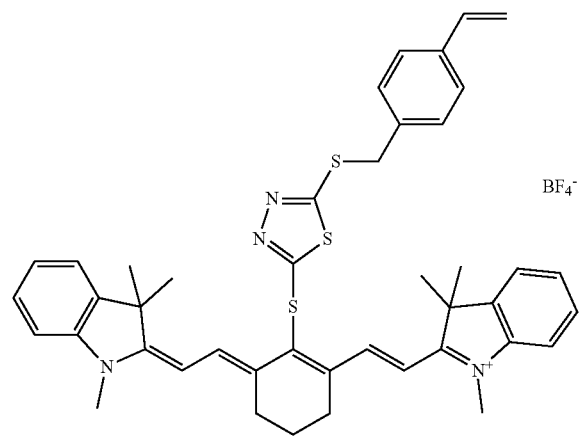

<Formation of Protective Layer>

Further, a protective layer-forming coating liquid (1) of the composition described below was applied onto the image recording layer by bar coating and dried in an oven at 120° C. for 60 seconds to form a protective layer having a dry coating weight of 0.15 g/m², thereby obtaining a lithographic printing plate precursor.

(Protective Layer-Forming Coating Liquid (1))
Dispersion of an inorganic layered compound (1) 1.5 g
6 wt % Aqueous solution of polyvinyl alcohol (CKS50; modified with sulfonic acid; degree of saponification, at least 99 mol %; degree of polymerization, 300; manufactured by The Nippon Synthetic Chemical Industry Co., Ltd.) 0.55 g
6 wt % Aqueous solution of polyvinyl alcohol (PVA-405; degree of saponification, 81.5 mol %; degree of polymerization, 500; manufactured by Kuraray Co., Ltd.) 0.03 g
1 wt % Aqueous solution of surfactant manufactured by Nihon Emulsion Co., Ltd. (EMALEX 710) 0.86 g
Ion exchanged water 6.0 g (Preparation of Dispersion of Inorganic Layered Compound (1))
Synthetic mica Somasif ME-100 (manufactured by Co-Op Chemical Co., Ltd.) in an amount of 6.4 parts by weight was added to 193.6 parts by weight of ion-exchanged water and dispersed in the water with a homogenizer to an average particle size (as measured by a laser scattering method) of 3 µm. The dispersed particles had an aspect ratio of at least 100.

<Evaluation Method>

(1) Press Life

The resulting lithographic printing plate precursor was exposed by Luxel PLATESETTER T-6000III manufactured by FUJIFILM Corporation equipped with an infrared semiconductor laser at an external drum rotational speed of 1,000 rpm, a laser power of 70% and a resolution of 2,400 dpi. The exposed image was set to contain a solid image and a 50% halftone chart of a 20 µm-dot FM (frequency modulation) screen.

The resulting lithographic printing plate precursor after exposure was mounted without development process on the plate cylinder of a Lithrone 26 printing press manufactured by Komori Corporation. A fountain solution of Ecolity-2 (manufactured by FUJIFILM Corporation)/tap water at (a volume ratio of) 2/98 and Values-G (N) black ink (manufactured by Dainippon Ink & Chemicals, Inc.) were used. The fountain solution and the ink were supplied by the standard automatic printing start-up procedure of the Lithrone 26 to perform on-press development, and printing was performed with 100 sheets of Tokubishi art paper (76.5 kg) at a printing rate of 10,000 sheets per hour.

The press life was evaluated by the number of impressions at the time when, after continuous printing, the decrease in density of a solid image became visually recognizable.

(2) Scumming Resistance

Printing was performed on the lithographic printing plate obtained in (1) above by Mitsubishi Dia type F2 printing press (manufactured by Mitsubishi Heavy Industries, Ltd.) using DIC-GEOS (s) red ink. The blanket was visually inspected for staining after 10,000 impressions had been printed, and evaluation was made based on the following criteria.

10: The blanket is not stained;
9: The blanket is very slightly stained;
8: The blanket is slightly stained but can be rated as good in practical use;
7: The blanket is stained but it poses no problem in practical use;
6: The blanket is stained within a tolerable level;
5: The blanket is stained, causing impressions to be somewhat stained (lowest tolerable level);
4: The blanket is stained, causing impressions to be clearly stained.

(3) Deinking Ability

Printing using the lithographic printing plate obtained in (1) above was suspended, and the printing plate was left to stand on the printing press for 4 hours in a room at a temperature of 25° C. and a humidity of 50%. Then, printing was resumed, and the deinking ability after suspended printing was evaluated as the number of sheets of printing paper required to obtain a good unstained impression.

The deinking ability was rated as 10 (number of wasted sheets: up to 20), 9 (number of wasted sheets: 21 to 25), 8 (number of wasted sheets: 26 to 45), 7 (number of wasted sheets: 46 to 70), 6 (number of wasted sheets: 71 to 100), 5 (number of wasted sheets: 101 to 150), 4 (number of wasted sheets: 151 to 200), 3 (number of wasted sheets: 201 to 250), 2 (number of wasted sheets: 251 to 300) and 1 (number of wasted sheets: 301 or more).

(4) Plate Inspection Properties (Image Visibility)

To quantitatively evaluate the visibility of exposed image portions of the lithographic printing plate obtained in (1) above, the lightness difference ΔL between the lightness $L^{*2}$ of exposed image portions and the lightness $L^*$ of unexposed non-image portions was measured with SpectroEye colorimeter manufactured by X-rite Inc. ΔL is a value determined by $L^{*1}$-$L^{*2}$ expressing a difference in lightness between two colors using the $L^*$ value representing the lightness in the $L^*a^*b^*$ color system. Thus, a larger ΔL value means higher visibility of exposed image portions and more excellent color development of the image portions.

The "Support" column in Table 2 shows one of <Treatment A> to <Treatment I> employed for manufacturing the aluminum support.

The "Average diameter" column shows the average diameter of the micropores at the surface of the anodized film.

The "Lightness L" column, the "Steepness a45(%)" column and the "Specific surface area ΔS" column respectively show the lightness $L^*$ in the $L^*a^*b^*$ color system, the steepness a45 and the specific surface area ΔS of the surface of the anodized film (the surface of the anodized film on the opposite side from the aluminum plate side) in the aluminum support.

The "Undercoat layer-forming treatment or hydrophilizing treatment" column shows the treatment (one of Treatments A to C) performed in <undercoat layer forming treatment or hydrophilizing treatment>.

In the "Image recording layer" column, "A" represents the use of the image recording layer-forming coating liquid A, "B" the use of the image recording layer-forming coating liquid B, and "C" the use of the image recording layer-forming coating liquid C.

In Table 1, "15 wt % phosphoric acid" refers to, as the electrolytic solution, using an aqueous solution having a phosphoric acid concentration of 15 wt % in place of an aqueous sulfuric acid solution.

TABLE 1

| | Surface roughening treatment | | | | | | First anodizing treatment | | | | Pore-widening treatment | | Second anodizing treatment | | | |
|---|---|---|---|---|---|---|---|---|---|---|---|---|---|---|---|---|
| | Brush graining | Alkali etching (g/m²) | Nitric acid electrolysis (C/dm²) | Alkali etching (g/m²) | Hydrochloric acid electrolysis (C/dm²) | Alkali etching (g/m²) | Sulfuric acid concentration of electrolytic solution (g/L) | Temp. (°C) | Current density (A/dm²) | Coating weight (g/m²) | Temp. (°C) | Time (sec) | Sulfuric acid concentration of electrolytic solution (g/L) | Temp. (°C) | Current density (A/dm²) | Coating weight (g/m²) |
| EX 1 | Done | 10 | 185 | 3.5 | 63 | 0.2 | 170 | 50 | 30 | 2.4 | 28 | 3 | — | — | — | — |
| EX 2 | Done | 10 | 185 | 3.5 | 63 | 0.2 | 170 | 50 | 30 | 2.4 | 32 | 3 | — | — | — | — |
| EX 3 | Done | 10 | 185 | 3.5 | 63 | 0.2 | 170 | 50 | 30 | 2.4 | 35 | 3 | — | — | — | — |
| EX 4 | Done | 10 | 185 | 3.5 | 63 | 0.2 | 170 | 50 | 30 | 2.4 | 37 | 3 | — | — | — | — |
| EX 5 | Done | 10 | 185 | 3.5 | 63 | 0.2 | 170 | 50 | 30 | 2.4 | 40 | 3 | — | — | — | — |
| EX 6 | Done | 10 | 185 | 3.5 | 63 | 0.2 | 170 | 50 | 30 | 2.4 | 40 | 5 | — | — | — | — |
| EX 7 | Done | 10 | 185 | 3.5 | 63 | 0.2 | 170 | 50 | 30 | 2.4 | 40 | 7 | — | — | — | — |
| EX 8 | Done | 10 | 185 | 3.5 | 63 | 0.2 | 170 | 15 | 30 | 2.4 | 40 | 9 | — | — | — | — |
| EX 9 | Done | 10 | 185 | 3.5 | 63 | 0.2 | 170 | 15 | 40 | 2.4 | 40 | 12 | — | — | — | — |
| EX 10 | Done | 10 | 185 | 2.5 | 63 | 0.2 | 170 | 15 | 60 | 2.4 | 40 | 15 | — | — | — | — |
| EX 11 | Done | 10 | 185 | 4.0 | 63 | 0.2 | 170 | 50 | 30 | 2.4 | 40 | 3 | — | — | — | — |
| EX 12 | Done | 10 | 185 | 5.0 | 63 | 0.2 | 170 | 50 | 30 | 2.4 | 40 | 3 | — | — | — | — |
| EX 13 | Done | 10 | 185 | 6.0 | 63 | 0.2 | 170 | 50 | 30 | 2.4 | 40 | 3 | — | — | — | — |
| EX 14 | Done | 10 | 185 | 8.0 | 63 | 0.2 | 170 | 50 | 30 | 2.4 | 40 | 3 | — | — | — | — |
| EX 15 | Done | 10 | 50 | 3.5 | 63 | 0.2 | 170 | 50 | 30 | 2.4 | 40 | 3 | — | — | — | — |
| EX 16 | Done | 10 | 100 | 3.5 | 63 | 0.2 | 170 | 50 | 30 | 2.4 | 40 | 3 | — | — | — | — |
| EX 17 | Done | 10 | 150 | 3.5 | 63 | 0.2 | 170 | 50 | 30 | 2.4 | 40 | 3 | — | — | — | — |
| EX 18 | Done | 10 | 200 | 3.5 | 63 | 0.2 | 170 | 50 | 30 | 2.4 | 40 | 3 | — | — | — | — |
| EX 19 | Done | 10 | 240 | 3.5 | 63 | 0.2 | 170 | 50 | 30 | 2.4 | 40 | 3 | — | — | — | — |
| EX 20 | Done | 10 | 185 | 3.5 | 63 | 0.2 | 170 | 50 | 30 | 2.4 | 40 | 3 | — | — | — | — |
| EX 21 | Done | 5 | 230 | 3.5 | 63 | 0.2 | 170 | 50 | 30 | 2.4 | 40 | 3 | — | — | — | — |
| EX 22 | — | 5 | 185 | — | 63 | 0.2 | 170 | 50 | 30 | 2.4 | 40 | 3 | — | — | — | — |
| EX 23 | — | 5 | 185 | — | 63 | 0.2 | 170 | 50 | 30 | 2.4 | 40 | 3 | — | — | — | — |
| EX 24 | — | 5 | — | — | 450 | 0.2 | 170 | 50 | 30 | 2.4 | 40 | 3 | — | — | — | — |
| EX 25 | — | 5 | — | — | 450 | 0.2 | 170 | 50 | 30 | 2.4 | 40 | 3 | — | — | — | — |
| EX 26 | — | 5 | — | — | 450 | 0.2 | 170 | 50 | 30 | 0.3 | 40 | 3 | 170 | 50 | 13 | 2.1 |
| EX 27 | — | 5 | — | — | 450 | 0.2 | 170 | 50 | 30 | 0.3 | 40 | 1 | 170 | 50 | 13 | 2.1 |
| EX 28 | — | 5 | — | — | 450 | 0.2 | 170 | 50 | 30 | 0.3 | 40 | 2 | 170 | 50 | 13 | 2.1 |
| EX 29 | — | 5 | — | — | 450 | 0.2 | 170 | 50 | 30 | 0.3 | 40 | 4 | 170 | 50 | 13 | 2.1 |
| EX 30 | Done | 10 | 185 | 3.5 | 63 | 0.2 | 170 | 50 | 30 | 2.4 | 40 | 3 | — | — | — | — |
| EX 31 | Done | 10 | 185 | 3.5 | 63 | 0.2 | 170 | 50 | 30 | 2.4 | 40 | 3 | — | — | — | — |
| EX 32 | — | 5 | — | — | 450 | 0.2 | 15 wt % Phosphoric acid | 35 | 4.5 | 1.0 | — | — | — | — | — | — |
| EX 33 | — | 5 | — | — | 450 | 0.2 | 15 wt % Phosphoric acid | 35 | 4.5 | 1.0 | 40 | 3 | 170 | 50 | 13 | 2.1 |
| EX 34 | — | 5 | — | — | 450 | 0.2 | 15 wt % Phosphoric acid | 35 | 4.5 | 1.0 | — | — | 170 | 50 | 13 | 2.1 |
| EX 35 | — | 5 | — | — | 450 | 0.2 | 15 wt % Phosphoric acid | 35 | 4.5 | 1.0 | 22 | 4 | 15 wt % Phosphoric acid | 35 | 4.5 | 1.2 |
| CE 1 | Done | 10 | 185 | 3.5 | 63 | 0.2 | 170 | 50 | 30 | 2.4 | 40 | 4 | — | — | — | — |
| CE 2 | Done | 10 | 185 | 3.5 | 63 | 0.2 | 170 | 15 | 60 | 2.4 | 40 | 18 | — | — | — | — |
| CE 3 | Done | 10 | 185 | 1.0 | 63 | 0.2 | 170 | 50 | 30 | 2.4 | 40 | 3 | — | — | — | — |

EX: Example
CE: Comparative Example

TABLE 2

| | Support | Aluminum support Average diameter (nm) | L* value | Steepness a45 (%) | Specific surface area ΔS (%) | Undercoat layer-forming treatment or hydrophilizing treatment | Image recording layer | Evaluation Press life (unit: ten thousand) | Scumming resistance | Deinking Ability | Plate inspection properties (image visibility) ΔL |
|---|---|---|---|---|---|---|---|---|---|---|---|
| EX 1 | A | 12 | 81 | 23 | 28 | C | A | 3.8 | 9 | 9 | 4 |
| EX 2 | A | 18 | 81 | 23 | 28 | C | A | 4.2 | 9 | 3 | 5 |
| EX 3 | A | 21 | 81 | 23 | 28 | C | A | 4.6 | 9 | 9 | 5 |
| EX 4 | A | 25 | 82 | 23 | 28 | C | A | 4.7 | 9 | 9 | 6 |
| EX 5 | A | 30 | 82 | 23 | 28 | C | A | 5.0 | 9 | 9 | 7 |
| EX 6 | A | 34 | 82 | 23 | 28 | C | A | 4.9 | 9 | 9 | 7 |
| EX 7 | A | 40 | 84 | 23 | 28 | C | A | 4.7 | 9 | 9 | 8 |
| EX 8 | A | 65 | 86 | 23 | 28 | C | A | 4.0 | 9 | 9 | 8 |
| EX 9 | A | 88 | 90 | 23 | 28 | C | A | 3.9 | 7 | 9 | 9 |
| EX 10 | A | 100 | 94 | 23 | 28 | C | A | 3.7 | 7 | 9 | 9 |
| EX 11 | A | 30 | 82 | 27 | 28 | C | A | 4.9 | 7 | 8 | 5 |
| EX 12 | A | 30 | 82 | 21 | 28 | C | A | 4.7 | 8 | 8 | 8 |
| EX 13 | A | 30 | 84 | 19 | 28 | C | A | 4.7 | 9 | 10 | 8 |
| EX 14 | A | 30 | 86 | 12 | 28 | C | A | 4.5 | 10 | 10 | 9 |
| EX 15 | A | 30 | 91 | 7 | 28 | C | A | 4.3 | 10 | 10 | 9 |
| EX 16 | A | 30 | 83 | 23 | 17 | C | A | 3.0 | 9 | 9 | 5 |
| EX 17 | A | 30 | 83 | 23 | 20 | C | A | 3.7 | 9 | 9 | 5 |
| EX 18 | A | 30 | 81 | 23 | 26 | C | A | 4.8 | 9 | 9 | 5 |
| EX 19 | A | 30 | 79 | 23 | 33 | C | A | 4.8 | 7 | 8 | 5 |
| EX 20 | A | 30 | 71 | 23 | 42 | C | A | 5.0 | 7 | 7 | 4 |
| EX 21 | A | 30 | 82 | 23 | 28 | A | A | 4.6 | 9 | 9 | 5 |
| EX 22 | A | 30 | 82 | 23 | 28 | B | A | 5.0 | 9 | 9 | 5 |
| EX 23 | A | 30 | 82 | 23 | 28 | None | A | 5.1 | 6 | 5 | 5 |
| EX 24 | C | 30 | 82 | 23 | 28 | C | A | 5.0 | 9 | 9 | 7 |
| EX 25 | B | 30 | 82 | 23 | 28 | C | A | 5.0 | 9 | 9 | 7 |
| EX 26 | D | 30 | 82 | 23 | 28 | C | A | 5.8 | 9 | 9 | 7 |
| EX 27 | D | 20 | 82 | 23 | 28 | C | A | 5.4 | 9 | 9 | 6 |
| EX 28 | D | 27 | 82 | 23 | 28 | C | A | 5.5 | 9 | 9 | 7 |
| EX 29 | D | 35 | 82 | 23 | 28 | C | A | 5.6 | 9 | 9 | 8 |
| EX 30 | A | 30 | 82 | 23 | 28 | C | B | 5.0 | 9 | 9 | 5 |
| EX 31 | A | 30 | 82 | 23 | 28 | C | B | 5.0 | 9 | 9 | 5 |
| EX 32 | E | 40 | 83 | 23 | 28 | A | C | 5.2 | 9 | 9 | 7 |
| EX 33 | F | 40 | 83 | 23 | 28 | A | C | 5.2 | 9 | 9 | 7 |
| EX 34 | G | 100 | 83 | 23 | 28 | A | C | 6.1 | 9 | 8 | 7 |
| EX 35 | H | 40 | 83 | 23 | 28 | A | C | 5.2 | 9 | 9 | 7 |
| CE 1 | A | 10 | 82 | 23 | 28 | C | A | 2.5 | 9 | 9 | 3 |
| CE 2 | A | 120 | 82 | 23 | 28 | C | A | 2.4 | 9 | 9 | 8 |
| CE 3 | A | 30 | 67 | 32 | 28 | C | A | 4.6 | 7 | 8 | 3 |

EX: Example
CE: Comparative Example

TABLE 3

| | Large-diameter portion | | Small-diameter portion | |
|---|---|---|---|---|
| | Average diameter (nm) | Depth (nm) | Average diameter (nm) | Depth (nm) |
| EX 26 | 30 | 100 | 8 | 900 |
| EX 27 | 20 | 100 | 8 | 900 |
| EX 28 | 27 | 100 | 8 | 900 |
| EX 29 | 35 | 100 | 8 | 900 |

EX: Examle

As shown in Table 2, the use of the lithographic printing plate precursor of the invention brought about the desired effects.

In particular, the comparison of Examples 1 to 10 revealed that, when the average diameter fell within the range of 15 to 60 nm, the balance among a press life, scumming resistance and image visibility was excellent.

The comparison of Examples 5 and 11 to 15 revealed that, when the steepness a45 was not more than 20%, scumming resistance and deinking ability were more excellent.

The comparison of Examples 5 and 16 to 20 revealed that, when the specific surface area ΔS was not less than 20%, the press life was longer.

The comparison of Examples 5 and 21 to 23 revealed that, when the undercoat layer was provided, scumming resistance and deinking ability were more excellent. When the undercoat layer contained a compound having the betain structure, scumming resistance and deinking ability were more excellent.

The comparison between Examples 26 to 29 and other Examples revealed that, when the anodized film had micropores each composed of the predetermined large-diameter portion and the predetermined small-diameter portion, the effects were further excellent.

Note that a lithographic printing plate precursor produced according to the same procedure as that of Example 1 described in Patent Literature 1 exhibited plate inspection properties (image visibility) comparable to those of Comparative Example 3, that is, poor plate inspection properties.

REFERENCE SIGNS LIST

1, 18 aluminum plate
2, 4 roller brush
3 abrasive slurry
5, 6, 7, 8 support roller
ta anodic reaction time
tc cathodic reaction time tp a period of time required for current to reach a peak from zero
Ia peak current on the anode cycle side
Ic peak current on the cathode cycle side
10 lithographic printing plate precursor
12a, 12b aluminum support
14 undercoat layer
16 image recording layer
20a, 20b anodized film
22a, 22b micropore
24 large-diameter portion
26 small-diameter portion
50 main electrolytic cell
51 AC power source
52 radial drum roller
53a, 53b main electrode
54 electrolytic solution feed inlet
55 electrolytic solution
56 slit
58 auxiliary anode
60 auxiliary anode cell
W aluminum plate
610 anodizing apparatus
612 power supply cell
614 electrolytic cell
616 aluminum plate
618, 626 electrolytic solution
620 power supply electrode
622, 628 roller
624 nip roller
630 electrolytic electrode
632 cell wall
634 DC power source

The invention claimed is:

1. A lithographic printing plate precursor comprising an aluminum support and an image recording layer,
wherein the aluminum support includes an aluminum plate and an anodized film of aluminum formed on the aluminum plate,
wherein the anodized film is positioned closer to the image recording layer than the aluminum plate is,
wherein the anodized film has micropores extending in a depth direction of the anodized film from a surface of the anodized film on the image recording layer side,
wherein the micropores have an average diameter of more than 10 nm but not more than 100 nm at the surface of the anodized film,
wherein the surface of the anodized film on the image recording layer side has a lightness L* of 79 to 100 in a L*a*b* color system,
wherein each of the micropores has a large-diameter portion which extends from the surface of the anodized film to a depth of 10 to 1000 nm and a small-diameter portion which communicates with a bottom of the large-diameter portion and extends to a depth of 20 to 2,000 nm from a communication position between the small-diameter portion and the large-diameter portion,
wherein an aperture average diameter of the large-diameter portion at the surface of the anodized film is 15 to 100 nm, and
wherein an aperture average diameter of the small-diameter portion at the communication position is not more than 13 nm.

2. The lithographic printing plate precursor according to claim 1,
wherein a steepness a45 representing an area ratio of portions having an inclination of at least 45° at the surface of the anodized film on the image recording layer side as determined by extracting components with a wavelength of 0.2 to 2 μm is not more than 30%.

3. The lithographic printing plate precursor according to claim 2,
wherein the steepness a45 is not more than 20%.

4. The lithographic printing plate precursor according to claim 1,
wherein the average diameter is from 15 to 60 nm.

5. The lithographic printing plate precursor according to claim 1,
wherein a specific surface area ΔS is not less than 20%, the specific surface area ΔS being a value determined by Formula (i):

$$\Delta S=(S_x-S_0)/S_0\times 100(\%) \quad (i)$$

using an actual area $S_x$ obtained, through three-point approximation, from three-dimensional data acquired by measurement at 512×512 points in 25 μm square of the surface of the anodized film on the image recording layer side by means of an atomic force microscope and a geometrically measured area $S_0$.

6. The lithographic printing plate precursor according to claim 5,
wherein the specific surface area ΔS is from 20% to 40%.

7. The lithographic printing plate precursor according to claim 1,
wherein the image recording layer contains a polymeric compound in a form of fine particles, and
wherein the polymeric compound in the form of fine particles is a copolymer of styrene-(meth)acrylonitrile-poly(ethylene glycol) monoalkyl ether (meth)acrylate compound.

8. The lithographic printing plate precursor according to claim 1,
wherein the image recording layer further contains a borate compound.

9. The lithographic printing plate precursor according to claim 1,
wherein the image recording layer further contains an acid color former.

10. The lithographic printing plate precursor according to claim 1, further including an undercoat layer between the aluminum support and the image recording layer.

11. The lithographic printing plate precursor according to claim 10,
wherein the undercoat layer contains a compound having a betain structure.

12. A method of manufacturing a lithographic printing plate, comprising:
an exposure step of imagewise exposing the lithographic printing plate precursor according to claim 1 to form exposed portions and unexposed portions; and
a removal step of removing the unexposed portions of the lithographic printing plate precursor having been imagewise exposed.

13. A printing method, comprising:
an exposure step of imagewise exposing the lithographic printing plate precursor according to claim 1 to form exposed portions and unexposed portions; and
a printing step of performing printing by supplying at least one of printing ink and fountain solution to remove the unexposed portions of the lithographic printing plate precursor having been imagewise exposed, on a printing press.

14. The lithographic printing plate precursor according to claim 2,
wherein the average diameter is from 15 to 60 nm.

15. The lithographic printing plate precursor according to claim 3,
wherein the average diameter is from 15 to 60 nm.

16. The lithographic printing plate precursor according to claim 2,
wherein a specific surface area ΔS is not less than 20%, the specific surface area ΔS being a value determined by Formula (i):

$$\Delta S = (S_x - S_0)/S_0 \times 100 (\%) \qquad (i)$$

using an actual area $S_x$ obtained, through three-point approximation, from three-dimensional data acquired by measurement at 512×512 points in 25 μm square of the surface of the anodized film on the image recording layer side by means of an atomic force microscope and a geometrically measured area $S_0$.

17. The lithographic printing plate precursor according to claim 1,
wherein the image recording layer further contains a polymerizable urethane compound.

18. The lithographic printing plate precursor according to claim 1,
wherein the image recording layer further contains cyanine dyes expressed by Formula (a) below, Formula (a)

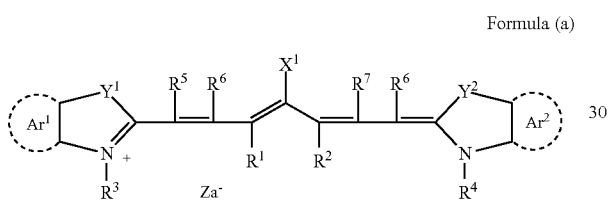

in Formula (a), $X^1$ represents a hydrogen atom, a halogen atom, —N($R^9$)($R^{10}$), —$X^2$-$L^1$ or the following group,

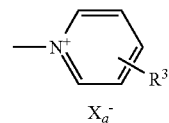

$R^9$ and $R^{10}$ each independently represent an aromatic hydrocarbon group, an alkyl group or a hydrogen atom; $R^9$ and $R^{10}$ may be bonded together to form a ring, $X^2$ represents an oxygen atom or a sulfur atom, and $L^1$ represents a hydrocarbon group having 1 to 12 carbon atoms and optionally a heteroatom, $X_a^-$ represents a counteranion, and $R^a$ represents a hydrogen atom, an alkyl group, an aryl group, an amino group or a halogen atom, $R^1$ and $R^2$ each independently represent a hydrocarbon group having 1 to 12 carbon atoms, $R^1$ and $R^2$ may be bonded together to form a ring, $Ar^1$ and $Ar^2$ each independently represent an aromatic hydrocarbon group optionally having a substituent, $Y^1$ and $Y^2$ each independently represent a sulfur atom or a dialkylmethylene group having up to 12 carbon atoms, $R^3$ and $R^4$ each independently represent a hydrocarbon group having up to 20 carbon atoms and optionally a substituent, $R^5$, $R^6$, $R^7$ and $R^8$ each independently represent a hydrogen atom or a hydrocarbon group having up to 12 carbon atoms, $Z_a^-$ represents a counteranion, where, when the cyanine dye expressed by Formula (a) has an anionic substituent in the structure and there is no need for charge neutralization, $Z_a^-$ is unnecessary.

* * * * *